(12) United States Patent
Naiini et al.

(10) Patent No.: US 7,416,830 B2
(45) Date of Patent: Aug. 26, 2008

(54) PHOTOSENSITIVE RESIN COMPOSITIONS

(75) Inventors: Ahmad A. Naiini, East Greenwich, RI (US); Richard Hopla, Cranston, RI (US); David B. Powell, Minnetonka, MN (US); Jon Metivier, Billerica, MA (US); Il'ya Rushkin, Walpole, MA (US)

(73) Assignee: Fujifilm Electronic Materials U.S.A., Inc., North Kingstown, RI (US)

( * ) Notice: Subject to any disclaimer, the term of this patent is extended or adjusted under 35 U.S.C. 154(b) by 42 days.

(21) Appl. No.: 10/966,349

(22) Filed: Feb. 18, 2005

(65) Prior Publication Data

US 2005/0181297 A1 Aug. 18, 2005
US 2006/0063095 A9 Mar. 23, 2006

Related U.S. Application Data

(60) Provisional application No. 60/511,198, filed on Oct. 15, 2003.

(51) Int. Cl.
*G03F 7/023* (2006.01)
*G03F 7/32* (2006.01)

(52) U.S. Cl. .............. 430/190; 430/191; 430/192; 430/193; 430/326; 430/330

(58) Field of Classification Search .......... 430/190, 430/191, 192, 193, 326, 18, 165, 330
See application file for complete search history.

(56) References Cited

U.S. PATENT DOCUMENTS

| 4,371,685 A | | 2/1983 | Ahne et al. ............ 528/73 |
| 4,818,658 A | | 4/1989 | Martin et al. ............ 430/156 |
| 5,362,599 A | * | 11/1994 | Knors et al. ............ 430/192 |
| 5,612,164 A | | 3/1997 | Canize et al. ............ 430/165 |
| 6,127,086 A | * | 10/2000 | Waterson et al. ............ 430/190 |
| 6,177,225 B1 | * | 1/2001 | Weber et al. ............ 430/190 |
| 6,524,764 B1 | | 2/2003 | Tomikawa et al. ............ 430/191 |
| 6,939,659 B2 | | 9/2005 | Naiini et al. ............ 430/190 |
| 7,056,641 B2 | | 6/2006 | Naiini et al. ............ 430/190 |
| 2002/0090564 A1 | * | 7/2002 | Suwa et al. ............ 430/191 |
| 2004/0229160 A1 | * | 11/2004 | Naiini et al. ............ 430/270.1 |
| 2004/0249110 A1 | * | 12/2004 | Naiini et al. ............ 528/173 |

FOREIGN PATENT DOCUMENTS

DE DD. 289 265 4/1991

* cited by examiner

*Primary Examiner*—John S. Chu
(74) *Attorney, Agent, or Firm*—Fish & Richardson P.C.

(57) ABSTRACT

A positive-working photosensitive composition comprising one or more polybenzoxazole precursor polymers, a diazonaphthoquinone photoactive compound which is the condensation product of a compound containing from 2 to about 9 aromatic hydroxyl groups with a 5-naphthoquinone diazide sulfonyl compound and a 4-naphthoquinone diazide sulfonyl compound, and at least one solvent, and the use of such compositions to form a relief pattern on a substrate thereby forming a coated substrate.

46 Claims, 1 Drawing Sheet

PHOTOSENSITIVE RESIN COMPOSITIONS

RELATED APPLICATIONS

This application claims priority from U.S. Provisional Patent Application No. 60/511,198 filed Oct. 15, 2003.

FIELD OF THE INVENTION

The present invention relates to positive photosensitive resin compositions. More specifically, the present invention relates to a positive-working, aqueous base developable photosensitive polybenzoxazole (PBO) precursor compositions, a process of use for said photosensitive composition, and electronic parts produced by said process of use.

BACKGROUND OF THE INVENTION

In microelectronic applications, polymers that demonstrate high temperature resistance are generally well known. Precursors of such polymers, such as polyimides and polybenzoxazoles can be made photoreactive with suitable additives. The precursors are converted to the desired polymer by known techniques such as exposure to high temperatures. The polymer precursors are used to prepare protective layers, insulating layers, and relief structures of highly heat-resistant polymers.

Conventional positive-working photosensitive polybenzoxazoles (PBO) contain an alkaline soluble PBO precursor and a diazoquinone photoactive compound as shown in U.S. Pat. No. 4,371,685. The diazoquinone compound inhibits the solubility of the PBO precursor in an aqueous base. After exposure to light, the diazoquinone compound undergoes photolysis and converts to indenecarboxylic acid, which promotes the aqueous base solubility of the PBO precursor. U.S. Pat. Nos. 6,177,225 and 6,127,086 teach the use of a PBO precursor, which contains diazoquinone moieties attached to its backbone along with a diazoquinone photoactive compound in positive-working photosensitive polybenzoxazole (PBO) compositions. Recently U.S. patent application Ser. No. 10/793337 disclosed a composition containing a polybenzoxazole precursor backbone mixed with a PBO precursor, which contained diazoquinone moieties attached to its backbone and at least one photoactive compound such as a diazoquinone compound. U.S. patent application Ser. No. 10/796587 disclosed a composition based on a PBO precursor, which contained diazoquinone moieties attached to its backbone and had the amines at the end of the polymer chain capped by various moieties and a diazoquionone photoactive compound. U.S. patent application Ser. No. 10/793341 discloses photosensitive polybenzoxazole precursor compositions that contained diazoquinone moieties attached to its backbone and contained diazoquinone compounds without active hydrogen in their structures. Such compositions provided light color films upon curing. U.S. patent application Ser. No. 10/796587 also disclosed a composition containing a PBO precursor, which contained diazoquinone moieties attached to its backbone and had the amines at the end of polymer chain capped by various moieties and had at least one photoactive compound (PAC) without active hydrogen to produce a light color film upon curing. In the art described above, the diazoquinone moiety employed in the photoactive compound was of a single type. Mixed diazoquinone compounds were not considered.

U.S. Pat. No. 4,818,658 disclosed a photoactive compound that was the reaction product of curcumin with 5-naphthoquinone diazide sulfonyl compounds and 4-naphthoquinone diazide sulfonyl compounds. U.S. Pat. No. 5,612,164 disclosed a positive photoresist comprising a trihydroxyphenylethane containing both 5-naphthoquinone diazide sulfonyl group and 4-naphthoquinone diazide sulfonyl group, and a trihydroxybenzophenone containing both 5-naphthoquinone diazide sulfonyl group and 4-naphthoquinone diazide sulfonyl group. German Patent No. DD 289,265 disclosed a photoactive compound containing both 5-naphthoquinone diazide sulfonyl group and a 4-naphthoquinone diazide sulfonyl group. U.S. Pat. No. 6,524,764 disclosed positive-type photosensitive polyimide and polybenzoxazole precursor compositions with photoactive compound containing both 5-naphthoquinone diazide sulfonyl group and 4-naphthoquinone diazide sulfonyl group. The 5-naphthoquinone diazide sulfonyl group and 4-naphthoquinone diazide sulfonyl group could be in the same molecule or in a mixture of two photoactive components.

SUMMARY OF THE INVENTION

The applicants surprisingly discovered that PBO compositions comprising a polybenzoxazole precursor resin and photoactive compounds containing both 5-naphthoquinone diazide sulfonyl group and 4-naphthoquinone diazide sulfonyl group have superior lithographic performance to those compositions comprising a polybenzoxazole precursor resin and photoactive compounds containing only 5-naphthoquinone diazide sulfonyl or only 4-naphthoquinone diazide sulfonyl.

Photosensitive formulations based on photoactive compounds containing both 5-naphthoquinone diazide sulfonyl group and 4-naphthoquinone diazide sulfonyl group have good imaging and mechanical properties as well as superior shelf life stability.

The present invention discloses a positive photosensitive resin composition comprising:

(a) one or more polybenzoxazole precursor polymers having structure (II) or structure (IV);

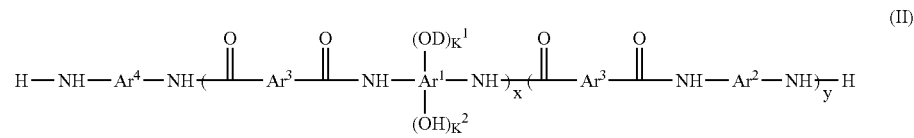

-continued

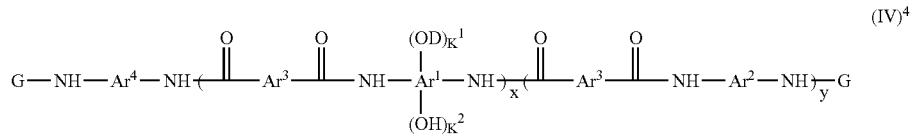

wherein $Ar^1$ is a tetravalent aromatic group, a tetravalent heterocyclic group, or mixtures thereof; $Ar^2$ is a divalent aromatic, a divalent heterocyclic, a divalent alicyclic, or a divalent aliphatic group that may contain silicon; $Ar^3$ is a divalent aromatic group, a divalent aliphatic group, a divalent heterocyclic group, or mixtures thereof; $Ar^4$ is $Ar^1(OD)_{k^1}(OH)_{k^2}$ or $Ar^2$, x is from about 10 to about 1000; y is from 0 to about 900; D is one of the following moieties:

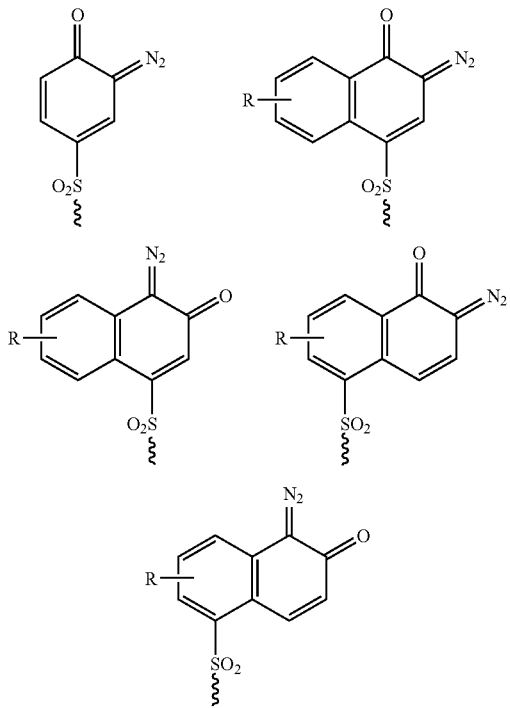

wherein R is H, halogen, $C_1$-$C_4$ alkyl group, $C_1$-$C_4$ alkoxy group, cyclopentyl or cyclohexyl; $k^1$ can be any positive value of up to about 0.5, $k^2$ can be any value from about 1.5 to about 2 with the proviso that $(k^1+k^2)=2$, G is a monovalent organic group having a carbonyl, carbonyloxy or sulfonyl group, (b) a diazonaphthoquinone photoactive compound which is the condensation product of a compound containing from 2 to about 9 aromatic hydroxyl groups with a 5-naphthoquinone diazide sulfonyl compound and a 4-naphthoquinone diazide sulfonyl compound, and (c) at least one solvent.

The present invention also concerns a process for forming a relief pattern and electronic parts using the photosensitive composition. The process comprises the steps of:

(a) coating on a suitable substrate, a positive-working photosensitive composition comprising one or more polybenzoxazole precursor polymers having any of the structures (II) or (IV), a photosensitive agent which is the condensation product of reaction of compound containing from 2 to about 9 aromatic hydroxyl groups with a 5-naphthoquinone diazide sulfonyl compound and a 4-naphthoquinone diazide sulfonyl compound, and at least one solvent, thereby forming a coated substrate;

(b) prebaking the coated substrate;

(c) exposing the prebaked coated substrate to actinic radiation;

(d) developing the exposed coated substrate with an aqueous developer, thereby forming an uncured relief image on the coated substrate; and (e) baking the developed coated substrate at an elevated temperature, thereby curing the relief image.

DETAILED DESCRIPTION OF THE INVENTION

The first embodiment of the present invention discloses a positive photosensitive resin composition comprising:

(a) one or more polybenzoxazole precursor polymers having structure (II) or structure (IV)

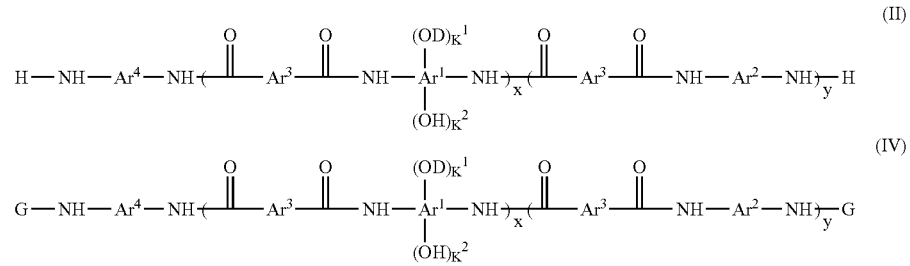

wherein $Ar^1$ is a tetravalent aromatic group, a tetravalent heterocyclic group, or mixtures thereof; $Ar^2$ is a divalent aromatic, a divalent heterocyclic, a divalent alicyclic, or a divalent aliphatic group that may contain silicon; $Ar^3$ is a divalent aromatic group, a divalent aliphatic group, a divalent heterocyclic group, or mixtures thereof; $Ar^4$ is $Ar^1(OD)_{k^1}(OH)_{k^2}$ or $Ar^2$, x is from about 10 to about 1000; y is from 0 to about 900; D is one of the following moieties:

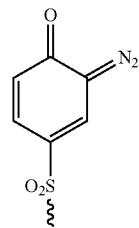
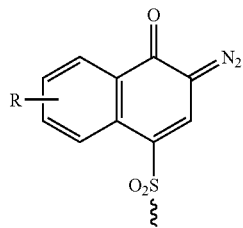
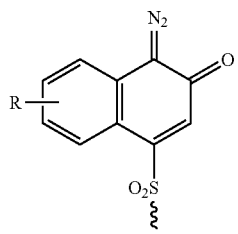
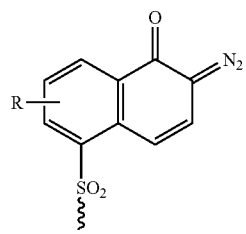
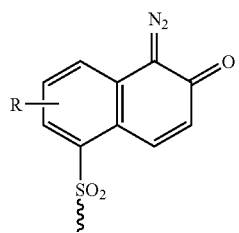

wherein, R is H, halogen, $C_1$-$C_4$ alkyl group, $C_1$-$C_4$ alkoxy group, cyclopentyl, or cyclohexyl;

$k^1$ can be any positive value of up to about 0.5, $k^2$ can be any value from about 1.5 to about 2 with the proviso that $(k^1+k^2)=2$, G is a monovalent organic group having a carbonyl, carbonyloxy or sulfonyl group;

(b) at least one photoactive compound which is the condensation product of a compound containing from 2 to about 9 aromatic hydroxyl groups with a 5-naphthoquinone diazide sulfonyl compound and a 4-naphthoquinone diazide sulfonyl compound, and (c) at least one solvent.

Polymers of Structures (II)) can be prepared from polymers of Structure (I) in one step.

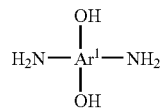 (V)

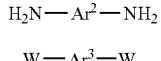 (VI)

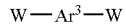 (VII)

In Structures (I), (V), (VI) and (VII) $Ar^1$, $Ar^2$, $Ar^3$, x, and y are as previously defined, and W is C(O)Cl, COOH or C(O)OR$^2$ and wherein $R^2$ is $C_1$-$C_7$ linear or branched alkyl group or a $C_5$-$C_8$ cycloalkyl group.

In Structures (II), (IV) and (V), $Ar^1$ is a tetravalent aromatic or a tetravalent heterocyclic group. Examples of $Ar^1$ include but are not limited to:

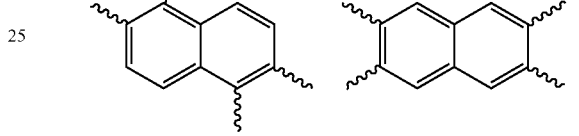
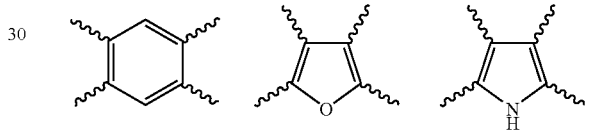
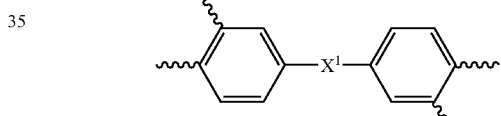
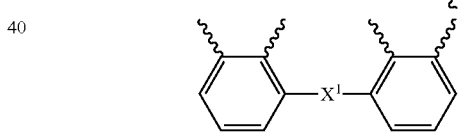

wherein $X^1$ is —O—, —S—, —C(CF$_3$)$_2$—, —C(CH$_3$)$_2$—, —CH$_2$—, —SO$_2$—, —NHCO— or —SiR$^1{}_2$— and each $R^1$ is independently a $C_1$-$C_7$ linear or branched alkyl or $C_5$-$C_8$ cycloalkyl group. Examples of $R^1$ include, but are not limited to, —CH$_3$, —C$_2$H$_5$, n-C$_3$H$_7$, i-C$_3$H$_7$, n-C$_4$H$_9$, t-C$_4$H$_9$, and cyclohexyl.

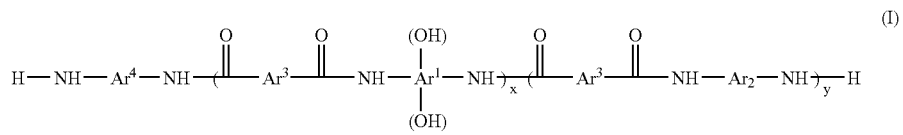 (I)

Polymer of Structure (I) can be prepared from monomers having Structures (V), (VI), (VII). Monomers having Structures (V), (VI), (VII) are reacted in the presence of a base to synthesize polybenzoxazole precursor polymers of Structure (I).

Examples of monomers having the Structure (V) containing $Ar^1$ include but are not limited to 2,2-bis(3-amino-4-hydroxyphenyl)hexafluoropropane, 3,3'-dihydroxy-4,4'-4,4'-diaminodiphenylether, 3,3'-dihydroxybenzidine, 4,6-diaminoresorcinol, and 2,2-bis(3-amino-4-hydroxyphenyl)

propane. The substitution pattern of the two hydroxy and two amino groups in the monomer of Structure (V) may be any of the possible substitution patterns with the proviso that the each amino group has an ortho relationship with a hydroxyl group in order to be able to form the benzoxazole ring. Furthermore, the polybenzoxazole precursor base polymer, may be synthesized using a mixture of two or more monomers described by generic Structure V.

In Structures (II), (IV) and (VI), $Ar^2$ is a divalent aromatic, a divalent heterocyclic, a divalent alicyclic, or a divalent aliphatic group that may contain silicon. Examples of $Ar^2$ include but are not limited to:

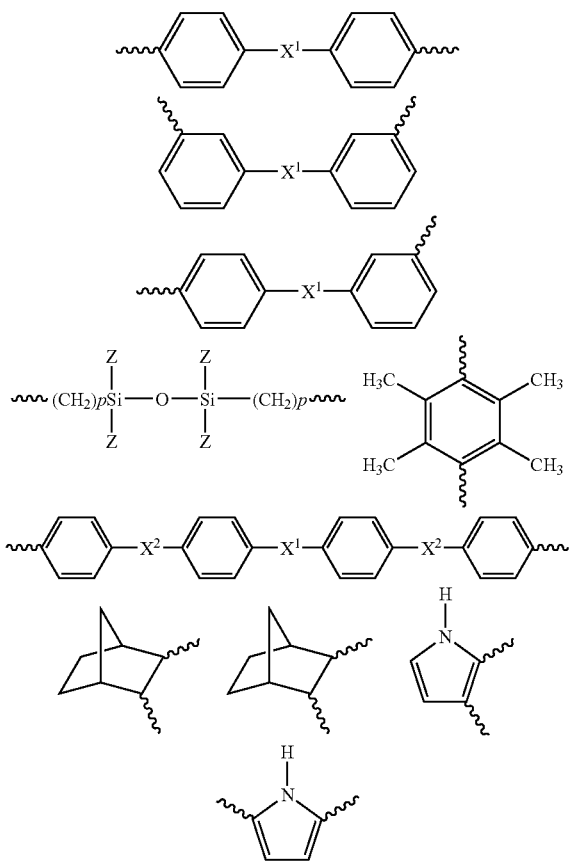

wherein $X^1$ is as defined before, $X^2$ is —O—, —S—, —C(CF$_3$)$_2$—, —C(CH$_3$)$_2$—, —CH$_2$—, —SO$_2$—, or —NHCO—, Z=H or $C_1$-$C_8$ linear, branched or cyclic alkyl and p is an integer from 1 to 6. Examples of suitable Z groups include, but are not limited to, methyl, ethyl, propyl, isopropyl, n-butyl, sec-butyl, t-butyl, n-octyl, cyclopentyl, cyclohexyl and cyclooctyl.

Examples of monomers having the Structure (VI) containing $Ar^2$ include, but are not limited to, 5(6)-diamino-1-(4-aminopheny)-1,3,3-trimethylindane (DAPI), m-phenylenediamine, p-phenylenediamine, 2,2'-bis(trifluoromethyl)-4,4'-diamino-1,1'biphenyl, 3,4'-diaminodiphenyl ether, 3,3'-diaminodiphenyl ether, 2,4-tolylenediamine, 3,3'-diaminodiphenyl sulfone, 3,4'-diaminodiphenyl sulfone, 4,4'3,3'-diaminodiphenylmethane, 3,4'-diaminodiphenylmethane, 4,4'-diaminodiphenyl ketone, 3,3'-diaminodiphenyl ketone, 3,4'-diaminodiphenyl ketone, 1,3-bis (4-aminophenoxy) benzene, 1,3-bis(3-aminophenoxy) benzene, 1,4-bis (γ-aminopropyl)tetramethyldisiloxane, 2,3,5,6-tetramethyl-p-phenylenediamine, m-xylylenediamine, p-xylylenediamine, methylenediamine, tetramethylenediamine, pentamethylenediamine, hexamethylenediamine, 2,5-dimethylhexamethylenediamine, 3-methoxyhexamethylenediamine, heptamethylenediamine, 2,5-dimethylheptamethylenediamine, 3-methylheptamethylenediamine, 4,4-dimethylheptamethylenediamine, octamethylenediamine, nonamethylenediamine, 2,5-dimethylnonamethylenediamine, decamethylenediamine, ethylenediamine, propylenediamine, 2,2-dimethylpropylenediamine, 1,10-diamino-1,10-dimethyldecane, 2,11-diaminidodecane, 1,12-diaminooctadecane, 2,17-diaminoeicosane, 3,3'-dimethyl-4,4'-diaminodiphenylmethane, bis(4-aminocyclohexyl) methane, 3,3'-diaminodiphenylethane, 4,4'-diaminodiphenylethane, 4,4'-diaminodiphenyl sulfide, 2,6-diaminopyridine, 2,5-diaminopyridine, 2,6-diamino-4-trifluoromethylpyridine, 2,5-diamino-1,3,4,-oxadiazole, 1,4-diaminocyclohexane, 4,4'-methylenedianiline, 4,4'4,4'-methylene-bis(o-choloroaniline), 4,4'-methylene-bis(3-methylaniline), 4,4'-methylene-bis(2-ethylaniline), 4,4'-methylene-bis(2-methoxyaniline), 4,4'-oxy-dianiline, 4,4'-oxy-bis-(2-methoxyaniline), 4,4'-oxy-bis-(2-chloroaniline), 4,4'-thio-dianiline, 4,4'-thio-bis-(2-methylaniline), 4,4'-thio-bis-(2-methyoxyaniline), 4,4'-thio-bis-(2-chloroaniline). Futhermore, the polybenzoxazole precursor base polymer, may be synthesized using a mixture of two or more monomers described by generic Structure VI.

In Structures (II), (IV) and (VII), $Ar^3$ is a divalent aromatic, a divalent aliphatic, or a divalent heterocyclic group. Examples of $Ar^3$ include but are not limited to:

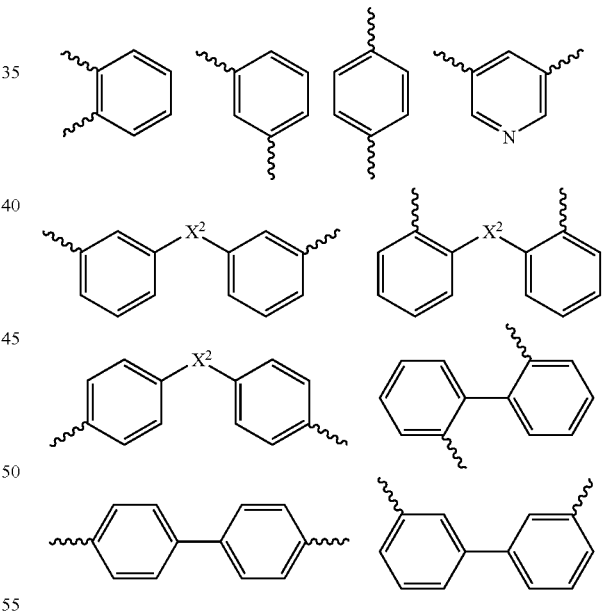

wherein $X^2$ is —O—, —S—, —C(CF$_3$)$_2$—, —C(CH$_3$)$_2$—, —CH$_2$—, —SO$_2$—, or —NHCO—.

In Structure (VII), W is C(O)Cl, COOH or C(O)OR$^2$ wherein R$^2$ is $C_1$-$C_7$ linear or branched alkyl group or a $C_5$-$C_8$ cycloalkyl group. Examples of R$^2$ include, but are not limited to, —CH$_3$, —C$_2$H$_5$, n-C$_3$H$_7$, i-C$_3$H$_7$, n-C$_4$H$_9$, t-C$_4$H$_9$, and cyclohexyl.

Monomers having the Structure (II) are diacids, diacid dichlorides and diesters. Examples of suitable dicarboxylic acids (W=COOH) include, but are not limited to, 4,4'-diphenyletherdicarboxylic acid, terephthalic acid, isophthalic acid and mixtures thereof. Examples of suitable diacid chlorides (W=COCl) include, but are not limited to, isophthaloyl dichloride, phthaloyl dichloride, terephthaloyl dichloride, 1,4-oxydibenzoyl chloride and mixtures thereof. Examples of suitable dicarboxylic esters (W=C(O)O$_2$R$^2$) include, but are not limited to: dimethylisophthalate, dimethylphthalate, dimethylterphthalate, diethylisophthalate, diethylphalate, diethylterphthalate and mixtures thereof.

Monomers having Structures (V) and (VI) and (VII) react to produce a polybenzoxazole precursor base polymer of Structure (I). Any conventional method for reacting a dicarboxylic acid or its dichloride or diester with at least one aromatic and/or heterocyclic dihydroxydiamine, and optionally, with at least one diamine, may be used. Generally, the reaction for diacid dichlorides (W=C(O)Cl) is carried out at about −10° C. to about 30° C. for about 6 to about 48 hours in the presence of an approximately stoichiometric amount of amine base. Examples of suitable amine bases include, but are not limited to pyridine, triethyl amine, 1,8-diazabicyclo [5.4.0]undec-7-ene (DBU), 1,5-diazabicyclo[4.3.0]non-5-ene (DBN), dimethyl pyridine, and dimethylaniline. The polybenzoxazole precursor base polymer of Structure (I) may be isolated by precipitation into water, recovered by filtration and dried. Descriptions of suitable syntheses employing diesters or diacids may be found in U.S. Pat. Nos. 4,395,482, 4,622,285, and 5,096,999, herein incorporated by reference.

The preferred reaction solvents are N-methyl-2-pyrrolidone (NMP), gamma-butyrolactone (GBL), N,N-dimethylformamide (DMF), N,N-dimethylacetamide (DMAc), dimethyl-2-piperidone, dimethylsulfoxide (DMSO), sulfolane, and diglyme. The most preferred solvents are N-methyl-2-pyrrolidone (NMP) and gamma-butyrolactone (GBL).

Monomers having structure (V), (VI), and (VII) are employed such that the ratio of [(V)+(VI)]/(VII) is generally from about 1 to about 1.2. Preferably, the ratio of [(V)+(VI)]/(VII) is generally from about 1 to about 1.1. The monomer having the Structure (V) is employed from about 10 to about 100 mole % of [(V)+(VI)] and the monomer having Structure (VI) is employed from about 0 to about 90 mole % of [(V)+(VI)]. Distribution of the polymeric units resulting from monomers having the Structures (V) and (VI) in the polybenzoxazole precursor base polymer may be random or in blocks within it.

In Structures (II) to (IV) x is an integer from about 10 to about 1000, y is an integer from about 0 to about 900 and (x+y) is about less then 1000. A preferred range for x is from about 10 to about 300 and a preferred range for y is from about 0 to about 250. A more preferred range for x is from about 10 to about 100 and a more preferred range for y is from about 0 to about 100. The most preferred range for x is from about 10 to about 50 and a most preferred range for y is from about 0 to about 5.

The amount of (x+y) can be calculated by dividing the numeric average molecular weight (Mn) of a polymer of Structure (I) by the average molecular weight of the repeat unit. The value of Mn can be determined by such standard methods as membrane osmometry or gel permeation chromatography as described, for example, in Jan Rabek, Experimental Methods in Polymer Chemistry, John Wiley & Sons, New York, 1983.

It should be noted that molecular weight and inherent viscosity of the polymers and therefore, x and y at a constant stoichiometry, can have a wide range depend on the reaction conditions such as the purity of the solvent, the humidity, presence or absence of a blanket of nitrogen or argon gas, reaction temperature, reaction time, and other variables.

Polybenzoxazole precursor polymer of Structure (II) may be synthesized by reaction of the polybenzoxazole precursor polymer of Structure (I) with about 1% to about 40 mole % of a diazoquinone (based on the number of OH groups from the monomer of Structure (I)) in the presence of a base to yield the polybenzoxazole precursor of Structure (II) according to Reaction 1.

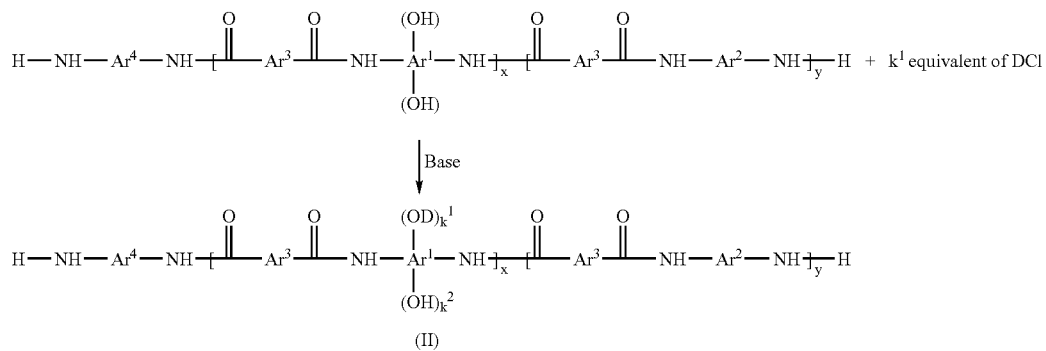

wherein Ar$^1$, Ar$^2$, Ar$^3$, Ar$^4$, D, k$^1$, k$^2$, x and y are as previously defined.

Examples of the diazoquinone compound DCl that can be reacted with the PBO polymer (I) include but are not limited to one of the following:

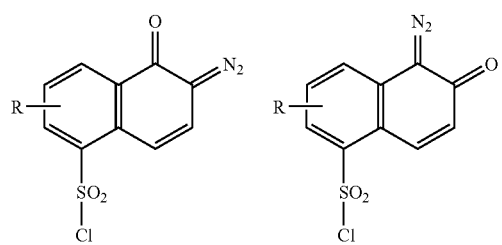

-continued

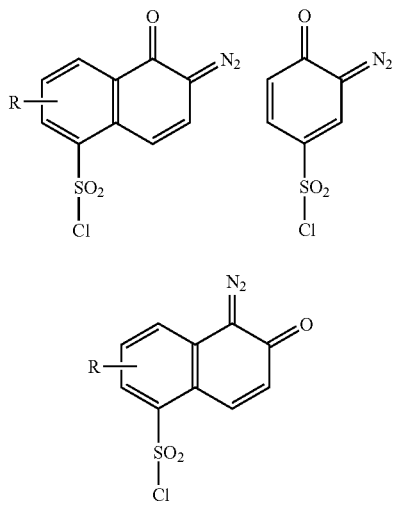

wherein, R is H, a halogen, a $C_1$-$C_4$ alkyl group, a $C_1$-$C_4$ alkoxy group, cyclopentyl or cyclohexyl. Examples of suitable R groups include, but are not limited to, methyl, ethyl, propyl, isopropyl, n-butyl, sec-butyl, t-butyl, cyclopentyl t or cyclohexyl.

Generally, the reaction is carried out at about 0° C. to about 30° C. for about 3 to about 24 hours in a solvent in the presence of a base. Generally, a slight excess of base to DCl is employed. Examples of bases include but are not limited to amine bases such as pyridine, trialkylamine, methylpyridine, lutidine, n-methylmorpholine, and the like. The most preferred base is triethylamine. The preferred reaction solvents are tetrahydrofuran, acetone, N-methyl-2-pyrrolidone (NMP), gamma-butyrolactone (GBL), N,N-dimethylformamide (DMF), N,N-dimethylacetamide (DMAc), dimethyl-2-piperidone, dimethylsulfoxide (DMSO), sulfolane, and diglyme. The most preferred reaction solvents are tetrahydrofuran and acetone. The reaction mixture should be protected from actinic rays.

The molar amount of DCl may range from about 1% to about 40% of the quantity of OH groups from monomers of Structure (V) to yield $k^1$ from 0.01 to about 0.4. A preferred amount of DCl is from about 1% to about 20% of the quantity of OH groups from monomers of Structure (V) to produce $k^1$ from 0.01 to about 0.20. A more preferred amount of DCl is from about 1% to about 10% of the quantity of OH groups from monomers of Structure (V) to produce $k^1$ from about 0.01 to about 0.10. A most preferred amount of DCl is from about 1% to about 5% of the quantity of OH groups from monomers of Structure (V) to produce $k^1$ from about 0.01 to about 0.05.

Polybenzoxazole precursor polymers of the following Structure (III):

wherein $Ar^1$ is a tetravalent aromatic group, a tetravalent heterocyclic group, or mixtures thereof; $Ar^2$ is a divalent aromatic, a divalent heterocyclic, a divalent alicyclic, or a divalent aliphatic group that may contain silicon; $Ar^3$ is a divalent aromatic group, a divalent aliphatic group, a divalent heterocyclic group, or mixtures thereof; $Ar^4$ is $Ar^1(OD)_k^1$ $(OH)_k^2$ or $Ar^2$ and G is a monovalent organic group having a carbonyl, carbonyloxy or sulfonyl group may be synthesized by reaction of polybenzoxazole base polymer of Structure (I) with G-M where G is a monovalent organic group having a carbonyl, carbonyloxy or sulfonyl group and M is a reactive leaving group. Examples of G include, but are not limited to the following structures:

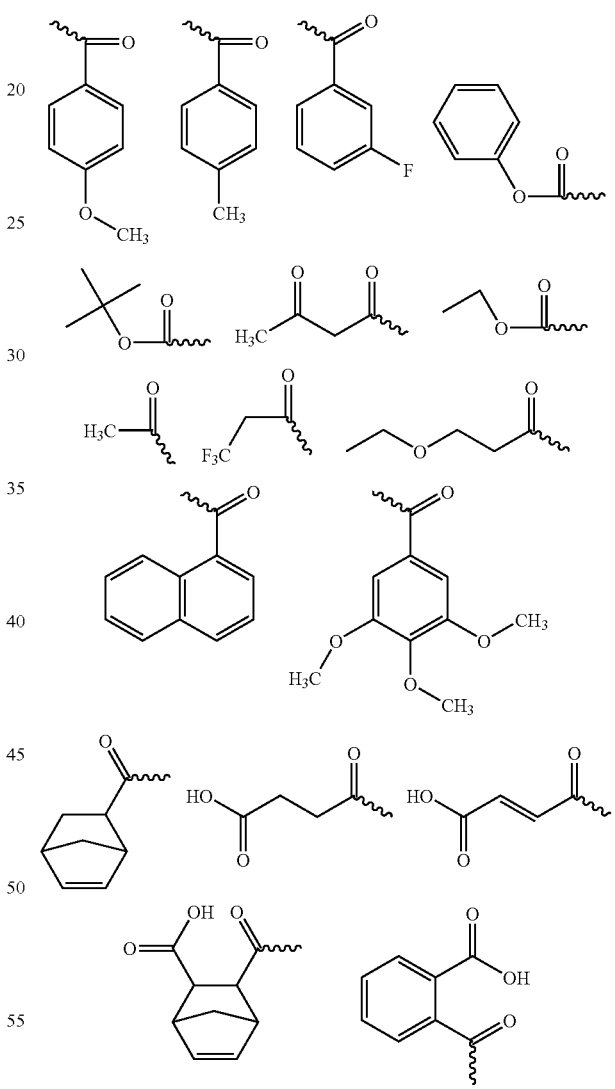

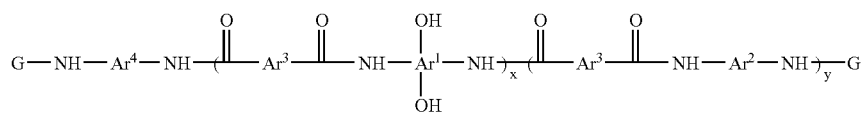

-continued

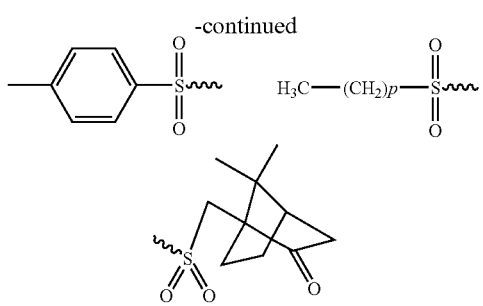

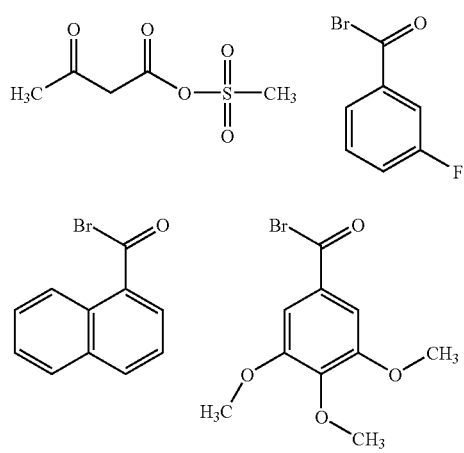

Examples of M groups include, but are not limited to, Cl, Br, mesylate, triflate, substituted carbonyloxy groups, and substituted carbonate groups.

Examples of suitable classes of G-M compounds includes but are not limited to carbon and sulfonic acid chlorides, carbon and sulfonic acid bromides, linear and cyclic carbon and sulfonic acid anhydrides, and alkoxy or aryloxy substituted acid chlorides. Examples of suitable G-M compounds include maleic anhydride, succinic anhydride, acetic anhydride, propionic anhydride, norbornene anhydride, phthalic anhydride, camphor sulfonic acid anhydride, trifluoromethane sulfonic acid anhydride, methanesulfonic acid anhydride, p-toluenesulfonic acid anhydride, ethanesulfonic acid anhydride, butanesulfonic acid anhydride, perfluorobutanesulfonic acid anhydride, acetyl chloride, methanesulfonyl chloride, trifluoromethanesulfonyl chloride, benzoyl chloride, norbornene carboxylic acid chloride, di-t-butyl dicarbonate, dimethyl dicarbonate, diethyldicarbonate, dibutyldicarbonate, t-butyl chloroformate, ethyl chloroformate, n-butyl chloroformate, and methyl chloroformate. Further examples include compounds having the structures shown below.

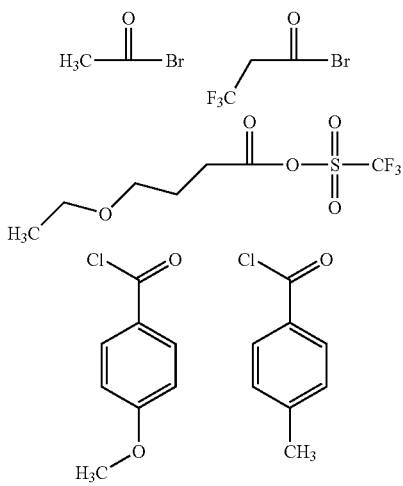

The reaction can be carried out in a suitable solvent by addition of G-M to a dry solution of the polybenzoxazole precursor base polymer at a temperature from about −25° C. to about 40° C. The more preferred temperature is from about 0° C. to about 25° C. The most preferred temperature is from about 5° C. to about 10° C. The reaction time is from about 1 hour to about 24 hours. The molar amount of GM employed is a slightly excess (3-6%) of the sum of the molar amounts of monomer of structures (V) and (VI) less the molar amount of monomer of structure (VII). Addition of organic or inorganic base may also be employed. Examples of suitable organic amine bases include, but are not limited to pyridine, triethyl amine, 1,8-diazabicyclo[5.4.0]undec-7-ene (DBU), 1,5-diazabicyclo[4.3.0]non-5-ene (DBN), dimethyl pyridine, and dimethylaniline. Examples of other suitable bases include sodium hydroxide, sodium carbonate, and sodium silicate.

The preferred reaction solvents are propyleneglycolmethylether acetate (PGMEA), N-methyl-2-pyrrolidone (NMP), gamma-butyrolactone (GBL), N,N-dimethylformamide (DMF), N,N-dimethylacetamide (DMAc), dimethyl-2-piperidone, dimethylsulfoxide (DMSO), tetrahydrofuran (THF), acetone, sulfolane, and diglyme. The most preferred solvents are diglyme and PGMEA.

Polybenzoxazole precursor polymer of Structure (IV) may be synthesized by reaction of polybenzoxazole precursor polymer of Structure (III) with about 1% to about 40% mole % of a diazoquinone (based on the number of OH groups from the monomer of Structure (III) in the presence of a base to yield the polybenzoxazole precursor (IV) according to Reaction 2.

Reaction 2

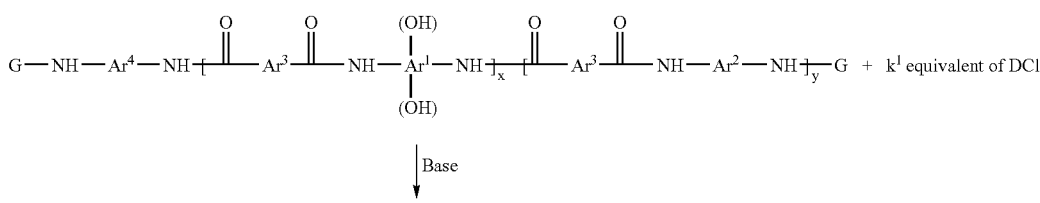

Base

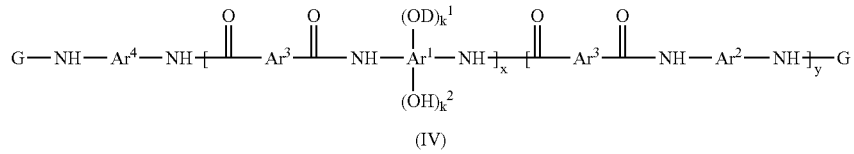

(IV)

wherein $Ar^1$, $Ar^2$, $Ar^3$, $Ar^4$, D, $k^1$, $k^2$, x, y, and G are as previously defined.

Examples of the diazoquinone compound DCl that can be reacted with the PBO polymer (III) include but are not limited to one of the following:

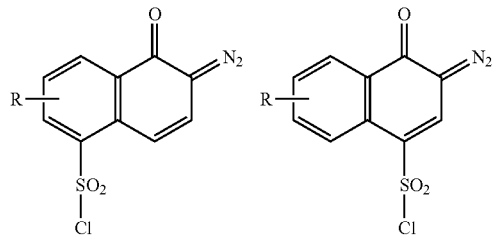

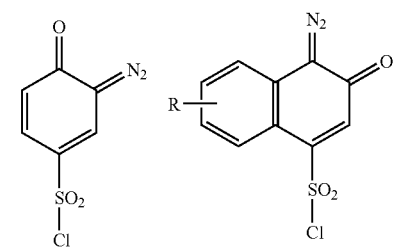

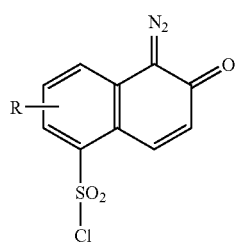

wherein, R is H, a halogen, a $C_1$-$C_4$ alkyl group, $C_1$-$C_4$ alkoxy group, cyclopentyl or cyclohexyl. Examples of suitable R groups include, but are nor limited to, methyl, ethyl, propyl, isopropyl, n-butyl, sec-butyl, t-butyl, cyclopentyl or cyclohexyl.

The molar amount of DCl may range from about 1% to about 40% of the quantity of OH groups from monomers of Structure (V) to yield $k^1$ from 0.01 to about 0.4. A preferred amount of DCl is from about 1% to about 20% of the quantity of OH groups from monomers of Structure (V) to produce $k^1$ from about 0.01 to about 0.20. A more preferred amount of DCl is from about 1% to about 10% of the quantity of OH groups from monomers of Structure (V) to produce $k^1$ from about 0.01 to about 0.10. A most preferred amount of DCl is from about 1% to about 5% of the quantity of OH groups from monomers of Structure (V) to produce $k^1$ from about 0.01 to about 0.05.

The reaction conditions are identical to that description for the synthesis of polybenzoxazole precursor polymer of Structure (II).

A polybenzoxazole precursor polymer of Structure (IV) can also be prepared by reaction of a polybenzoxazole precursor polymer of Structure (II) with G-M. The definition of G and M are as defined before and the reaction condition is the same as described for the preparation of polybenzoxazole precursor polymer of Structure (III).

The photoactive compound (b) of the photosensitive resin composition are those of the following compounds (VIII) and comprises one or more diazonaphthoquinone photoactive compounds which are the condensation products of compounds containing from 2 to about 9 aromatic hydroxyl groups with a 5-naphthoquinone diazide sulfonyl compound and a 4-naphthoquinone diazide sulfonyl compound.

The phenolic compounds (i.e. the backbone) typically employed in the preparation of a photoactive compound may be prepared by any suitable method.\ A common method of as methanol. The reaction is most often catalyzed by a strong acid (e.g. sulfuric acid or p-toluene sulfonic acid). Generally, the reaction is carried out at about 15° C. to about 80° C. for about 3 hours to about 48 hours.

The photoactive compounds (VIII) are synthesized by reaction of the backbone with DCl. Generally, the reaction is carried out at about 0° C. to about 30° C. for about 4 to about 36 hours in a solvent in the presence of a base. Generally, a slight excess of base to DCl is employed. Examples of bases include but are not limited to amine bases such as pyridine, trialkylamine, methylpyridine, lutidine, n-methylmorpholine, and the like. The most preferred base is triethylamine. The preferred reaction solvents are tetrahydrofuran (THF), gamma-butyrolactone (GBL), N,N-dimethylformamide (DMF), acetone, N,N-dimethylacetamide (DMAc), dimethyl-2-piperidone, dimethylsulfoxide (DMSO), sulfolane, and diglyme. The most preferred solvents are tetrahydrofuran (THF), acetone and gamma-butyrolactone (GBL). The reaction mixture should be protected from actinic rays.

Examples of compounds (VIII) include, but are not limited to, one or more of the following compounds:

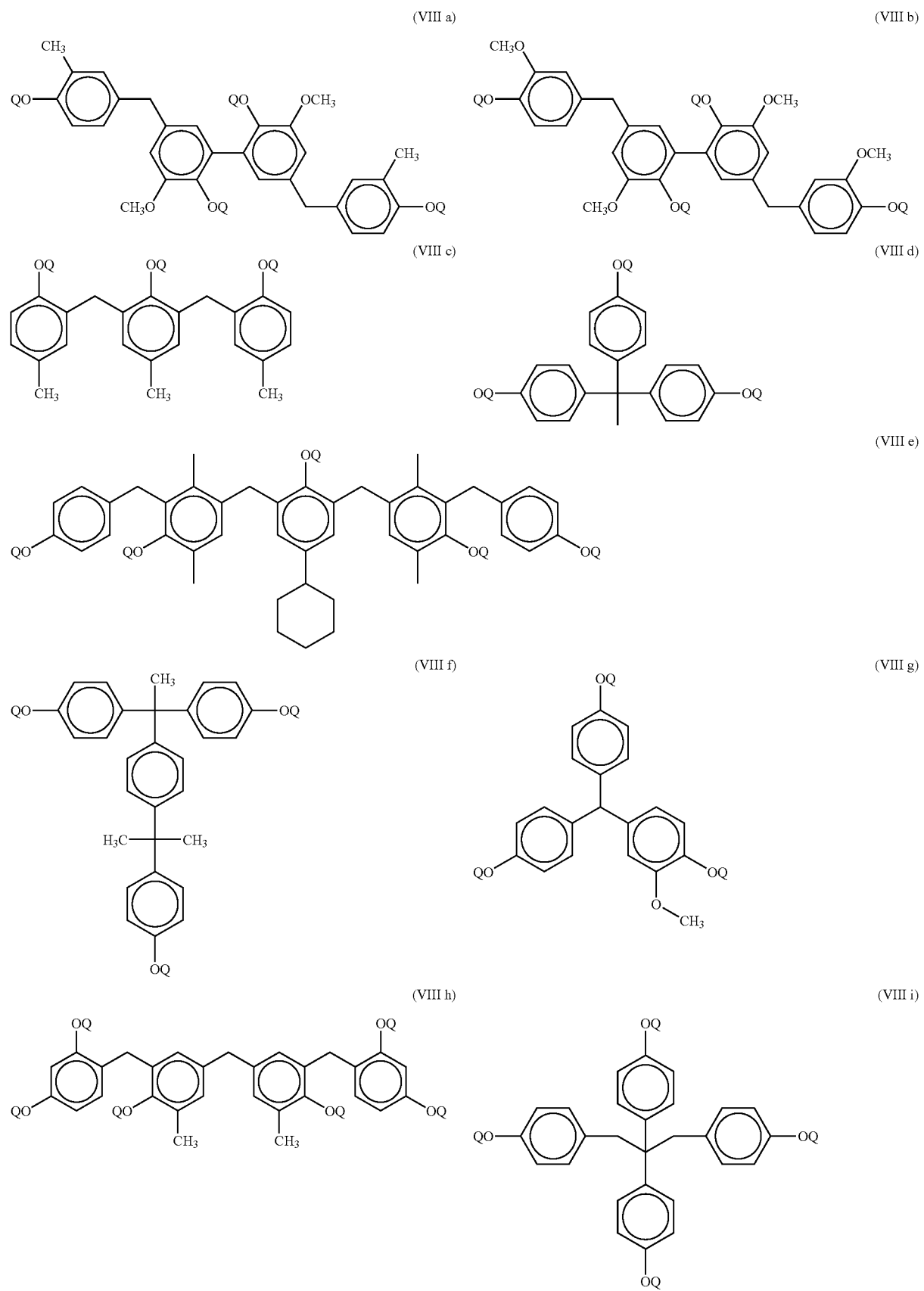

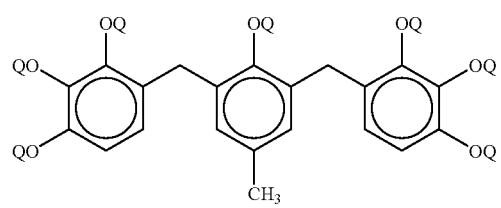 (VIII j)
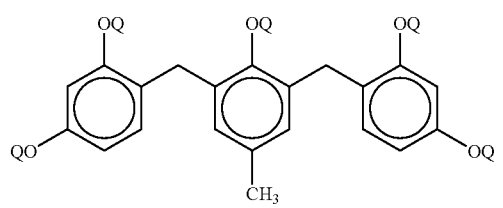 (VIII k)
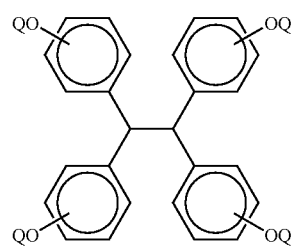 (VIII l)
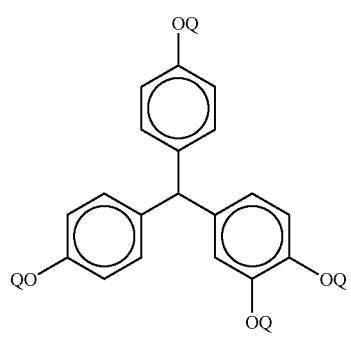 (VIII m)
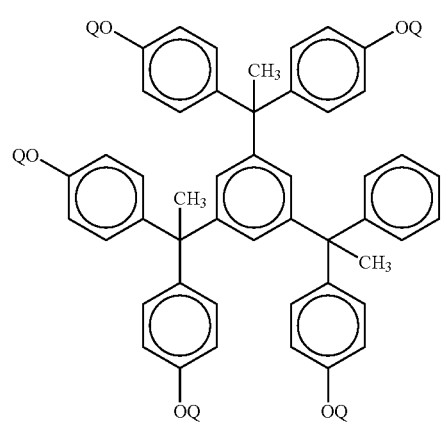 (VIII n)
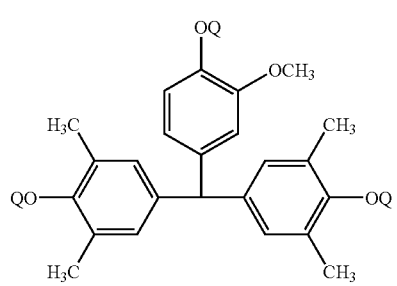 (VIII o)
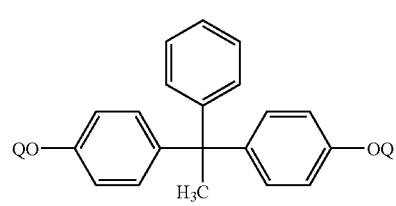 (VIII p)
wherein at least one Q is (IX) and another Q is (X) with any remainder being H.
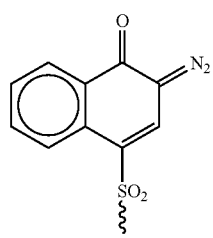 (IX)
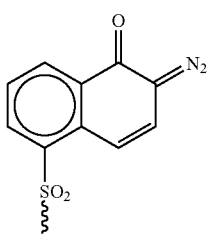 (X)

The ratio of (IX)/(X) is from about 1/99 to about 99/1. A preferred ratio of (IX)/(X) is from about 20/80 to about 80/20. In compound VIII, Q=H may be from about 0% to about 90%. A preferred compound VIII is where Q=H is from about 0 to about 75%. A more preferred VIII is where Q=H is from about 0 to about 50%. A most preferred VIII is where Q=H is from about 2% to about 34%.

The diazonaphthoquinone photoactive compound which comprises the condensation product of a compound containing from 2 to about 9 aromatic hydroxyl groups with a 5-naphthoquinone diazide sulfonyl compound and a 4-naphthoquinone diazide sulfonyl compound may further contain similar condensation products containing only a 5-naphthoquinone diazide sulfonyl moiety (moieties) or only a 4-naphthoquinone diazide sulfonyl moiety (moieties).

Suitable solvents of this photosensitive composition are polar organic solvents. Suitable examples of polar organic solvents include but are not limited to, N-methyl-2-pyrrolidone (NMP), gamma-butyrolactone (GBL), N,N-dimethylacetamide (DMAc), dimethyl-2-piperidone, N,N-dimethylformamide (DMF), and mixtures thereof. The preferred solvents are gamma-butyrolactone and N-methyl-2-pyrrolidone. The most preferred solvent is gamma-butyrolactone.

The amount of polybenzoxazole precursor polymers of Structures (II) or (IV) in the photosensitive composition is from about 5 wt. % to about 50 wt. %. The more preferred amount of polybenzoxazole precursor polymers of Structures (II) or (IV) is from about 30 wt. % to about 40 wt. %. Polybenzoxazole precursor polymers of Structures (II) or (IV) can be used singly or be combined in any ratio. Up to 25% of the amount of the polybenzoxazole precursor polymers of Structures (II) or (IV) may be replaced by other organic solvent soluble, aqueous base soluble, aromatic or heterocyclic group polymers or copolymers. Examples of organic solvent soluble, aqueous base soluble, aromatic or heterocyclic group polymers or copolymers may include polyimides, polybenzoimidazoles, polybenzothiazoles, polytriazoles, polyquinazolones, polyquinazolindiones, polyquinacridones, polybenxazinones, polyanthrazolines, polyoxadiazoles, polyhydantoins, polyindophenazines, or polythiadiazoles.

The amount of photosensitive compound, i.e., diazoquinone compound (VIII), used in this composition is from about 1 wt. % to about 20 wt. % of the total weight of the composition, preferably, about 2 wt. % to 10 wt. %, and most preferably, about 3 wt. % to about 6 wt. %.

The solvent component (c) comprises about 40 wt. % to about 80 wt. % of the photosensitive composition. A preferred solvent range is from about 45 wt. % to about 70 wt. %. A more preferred range of solvent is from about 50 wt. % to about 65 wt. %.

Optionally, an adhesion promoter may be included in the photosensitive composition. If employed, the amount of adhesion promoter ranges from about 0.1 wt. % to about 2 wt. % of total weight of composition. A preferred amount of adhesion promoter is from about 0.2 wt. % to about 1.5 wt. %. A more preferred amount of adhesion promoter is from about 0.3 wt. % to about 1 wt. %. Suitable adhesion promoters include, for example, amino silanes, and mixtures or derivatives thereof. Examples of suitable adhesion promoters which may be employed in the invention may be described by Structure XI

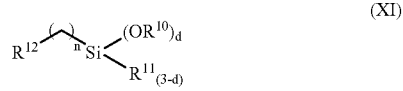

wherein each $R^{10}$ is independently a $C_1$-$C_4$ alkyl group or a $C_5$-$C_7$ cycloalkyl group and each $R^{11}$ is independently a $C_1$-$C_4$ alkyl group, a $C_1$-$C_4$ alkoxy group, a $C_5$-$C_7$ cycloalkyl group or a $C_5$-$C_7$ cycloalkoxy group; d is an integer from 0 to 3 and n is an integer from 1 to about 6. $R^{12}$ is one of the following moieties:

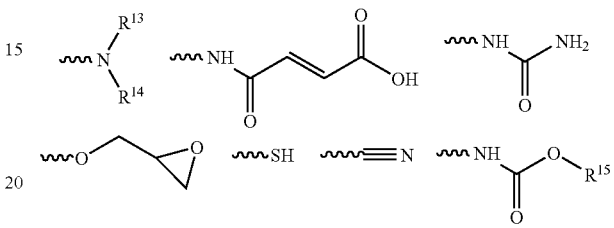

wherein each $R^{13}$ and $R^{14}$ are independently a $C_1$-$C_4$ alkyl group or a $C_5$-$C_7$ cycloalkyl group, and $R^{15}$ is a $C_1$-$C_4$ alkyl group and a $C_5$-$C_7$ cycloalkyl group. Preferred adhesion promoters are those wherein $R^{12}$ are

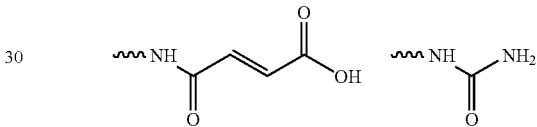

More preferred adhesion promoters are those wherein $R^{12}$ is

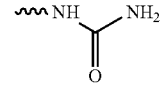

The most preferred adhesion promoters are

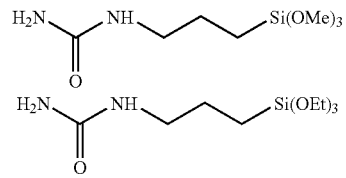

The photosensitive compositions of the present invention may further include other additives. Suitable additives include, for example, leveling agents, dissolution inhibitors and the like. Such additives may be included in the photosensitive compositions in about 0.03 to about 10 wt % of the total weight of composition.

The second embodiment of the present invention concerns a process for forming a relief pattern using the photosensitive composition. The process comprises the steps of:
(a) coating on a suitable substrate, a positive-working photosensitive composition comprising one or more polybenzoxazole precursor polymers having Structures (II) or (IV), a diazonaphthoquinone photoactive compound which is the condensation product of a compound containing from 2 to about 9 aromatic hydroxyl groups with a 5-naphthoquinone diazide sulfonyl compound and a 4-naphthoquinone diazide sulfonyl compound, and at least one solvent, thereby forming a coated substrate;

(b) prebaking the coated substrate;
(c) exposing the prebaked coated substrate to actinic radiation;
(d) developing the exposed coated substrate with an aqueous developer, thereby forming an uncured relief image on the coated substrate; and
(e) baking the developed coated substrate at an elevated temperature, thereby curing the relief image.

The process may optionally include the step of post exposure baking the exposed coated substrate at an elevated temperature, prior to developing. Still another optional step is rinsing the developed substrate, prior to curing.

The positive acting, photoactive resin of this invention is coated on a suitable substrate. The substrate may be, for example, semiconductor materials such as a silicon wafer or a ceramic substrate, glass, metal, or plastic. Coating methods include, but are not limited to spray coating, spin coating, offset printing, roller coating, screen printing, extrusion coating, meniscus coating, curtain coating, and immersion coating. The resulting film is prebaked at an elevated temperature. The bake may be completed at one or more temperatures within the temperature bake of from about 70° C. to about 120° C. for several minutes to half an hour, depending on the method, to evaporate the remaining solvent. Any suitable baking means may be employed. Examples of suitable baking means include, but are not limited to, hot plates and convection ovens. The resulting dry film has a thickness of from about 3 to about 50 micron or more preferably from about 4 to about 20 micron or most preferably from about 5 to about 15 micron.

After the bake, step, the resulting dry film is exposed to actinic rays in a preferred pattern through a mask. X-rays, electron beam, ultraviolet rays, visible light, and the like can be used as actinic rays. The most preferable rays are those with wavelength of 436 nm (g-line) and 365 nm (i-line).

Following exposure to actinic radiation, in an optional step it may be advantageous to heat the exposed and coated substrate to a temperature between about 70° C. and 120° C. The exposed and coated substrate is heated in this temperature range for a short period of time, typically several seconds to several minutes and may be carried out using any suitable heating means. Preferred means include baking on a hot plate or in a convection oven. This process step is commonly referred to in the art as post exposure baking.

Next, the film is developed using an aqueous developer and a relief pattern is formed. The aqueous developer contains aqueous base. Examples of suitable bases include, but are not limited to, inorganic alkalis (e.g., potassium hydroxide, sodium hydroxide, ammonia water), primary amines (e.g., ethylamine, n-propylamine), secondary amines (e.g. diethylamine, di-n-propylamine), tertiary amines (e.g., triethylamine), alcoholamines (e.g. triethanolamine), quaternary ammonium salts (e.g., tetramethylammonium hydroxide, tetraethylammonium hydroxide), and mixtures thereof. The concentration of base employed will vary depending on the base solubility of the polymer employed and the specific base employed. The most preferred developers are those containing tetramethylammonium hydroxide (TMAH). Suitable concentrations of TMAH range from about 1% to about 5%. In addition, an appropriate amount of a surfactant can be added to the developer. Development can be carried out by means of immersion, spray, puddle, or other similar developing methods at temperatures from about 10° C. to about 40° C. for about 30 seconds to about 5 minutes. After development, the relief pattern may be optionally rinsed using deionized water and dried by spinning, baking on a hot plate, in an oven, or other suitable means.

The benzoxazole ring is then formed by curing of the uncured relief pattern to obtain the final high heat resistant pattern. Curing is performed by baking the developed, uncured relief pattern at or above the glass transition temperature $T_g$ of the photosensitive composition to obtain the benzoxazole ring that provides high heat resistance. Typically, temperatures above about 200° C. are used.

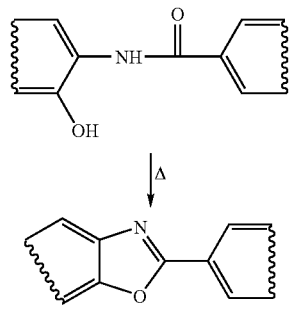

Preferably, temperatures from about 250° C. to about 400° C. are applied. The curing time is from about 15 minutes to about 24 hours depending on the particular heating method employed. A more preferred range for the curing time is from about 20 minutes to about 5 hours and the most preferred range of curing time is from about 30 minutes to about 3 hours. Curing can be done in air or preferably, under a blanket of nitrogen and may be carried by any suitable heating means. Preferred means include baking on a hot plate or in a convection oven.

Figure 1:
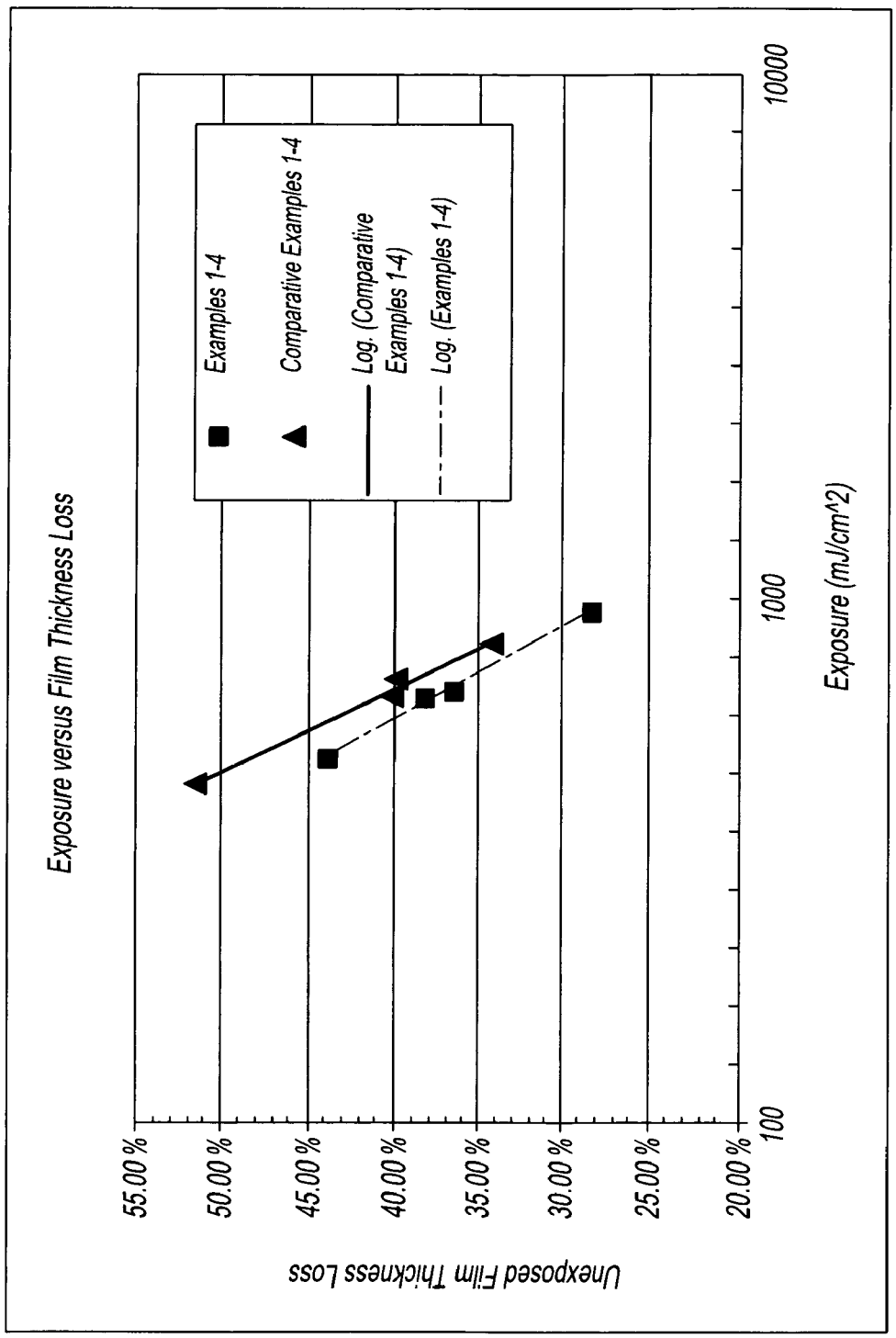
FIGS. 1 is a graph of exposure versus film thickness loss for compositions of this invention and comparative compositions.

To illustrate the present invention, the following examples are provided. It should be understood that the present invention is not limited to the examples described.

SYNTHESIS EXAMPLE 1

Synthesis of Polybenzoxazole Precursor Polymer of Structure (Ia)

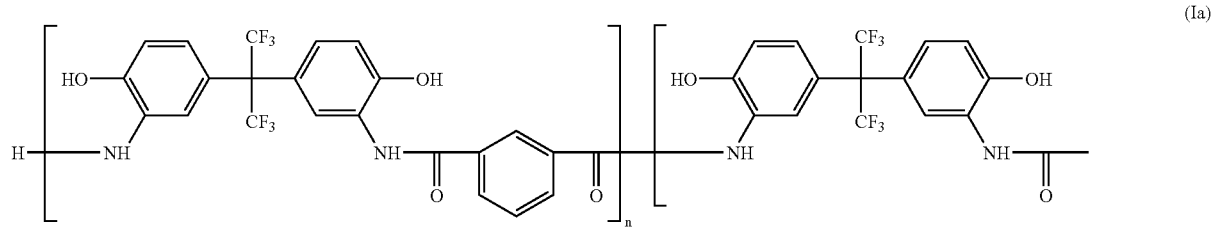

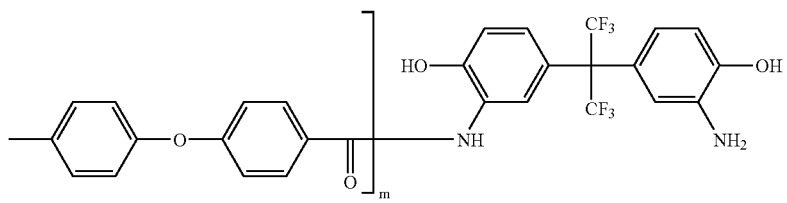

To a 100 mL three-necked round bottom flask equipped with a mechanical stirrer, nitrogen inlet and addition funnel, 3.66 g (10 mmol) of hexafluoro-2,2-bis(3-amino-4-hydroxyphenyl)propane, 1.70 g (21 mmol) of pyridine and 15 g of N-methyl-2-pyrrolidone (NMP) were added. The solution was stirred at room temperature until all solids was dissolved and then was cooled in an ice water bath at 0-5° C. To this solution, 1.01 g (5 mmol) of isophthaloyl chloride and 1.477 g (5 mmol) of 1,4-oxydibenzoyl chloride dissolved in 10 g of NMP was added drop-wise. After the addition was completed, the resulting mixture was stirred at room temperature for 18 hours. The viscous solution was precipitated in 800 mL of vigorously stirred de-ionized water. The polymer was collected by filtration and washed with de-ionized water and a water/methanol (50/50) mixture. The polymer was dried under vacuum at 105° C. for 24 hours. The yield was almost quantitative and the inherent viscosity of the polymer was 0.36 dL/g measured in NMP at the concentration of 0.5 g/dL at 25° C.

SYNTHESIS EXAMPLE 2

Synthesis of Polymer of Structure (Ia) with Alternative Monomer Ratio

To a 2 L, three-necked, round bottom flask equipped with a mechanical stirrer, nitrogen inlet and addition funnel, 155.9 g (426.0 mmol) of hexafluoro-2,2-bis(3-amino-4-hydroxyphenyl)propane, 64.3 g (794.9 mmol) of pyridine, and 637.5 g of N-methylpyrrolidone (NMP) were added. The solution was stirred at room temperature until all solids dissolved, then cooled in an ice water bath at 0-5° C. To this solution, 39.3 g (194 mmol) of isophthalyl chloride, and 56.9 g (194 mmol) of 1,4-oxydibenzoyl chloride dissolved in 427.5 g of NMP, were added drop-wise. After the addition was completed, the resulting mixture was stirred at room temperature for 18 hours. The viscous solution was precipitated in 10 liters of vigorously stirred de-ionized water. The polymer was collected by filtration and washed with de-ionized water and a water/methanol (50/50) mixture. The polymer was dried under vacuum conditions at 105° C. for 24 hours.

The yield was almost quantitative and the inherent viscosity (iv) of the polymer was 0.20 dL/g measured in NMP at a concentration of 0.5 g/dL at 25° C.

The number average molecular weight (Mn) was determined by gel permeation chromatography using four Phenogel 10 columns with pore sizes of $10^4$ A, 500 A, 100 A and 50 A and THF as an eluent. Polystyrene standards were used for calibration. The typical Mn for a polymer prepared by the above procedure was 5,800. The average molecular weight of the repeat unit is about 540, so the degree of polymerization (x+y) was determined to be about 11 (5800/540). Since y=0, X=11.

SYNTHESIS EXAMPLE 3

Synthesis of Polybenzoxazole Precursor Polymer of Structure (IIa)

To a 100 mL three-necked round bottom flask equipped with a mechanical stirrer, 5.42 g (10.0 mmol) of the polymer obtained in Synthesis Example 1 and 50 mL of tetrahydrofuran (THF) were added. The mixture was stirred for ten minutes and the solid was fully dissolved. 0.81 g (3 mmole) of 5-naphthoquinone diazide sulfonyl chloride was then added and the mixture was stirred for another 10 minutes. Triethylamine, 0.3 g (3 mmol), was added gradually within 15 minutes and then the reaction mixture was stirred for 5 hours. The reaction mixture was then added gradually to 500 mL of vigorously stirred de-ionized water. The precipitated product was separated by filtration and washed with 200 mL of de-ionized water. To the product was added another 600 mL de-ionized water and the mixture vigorously stirred for 30 minutes. After filtration the product was washed with 100 mL de-ionized water. The isolated product was dried at 40° C. overnight. The yield was 91%.

SYNTHESIS EXAMPLE 4

Synthesis of Polybenzoxazole Precursor Polymer of Structure (IIa) Having Alternate Monomer Ratios Synthesis Example 3 was repeated except the polymer obtained in Synthesis Example 2 was reacted with 3 mole % of 5-naphthoquinone diazide sulfonyl chloride. The inherent viscosity of the polymer was 0.21 dL/g measured in NMP at the concentration of 0.5 g/dL at 25° C.

SYNTHESIS EXAMPLE 5

Synthesis of a Polybenzoxazole Precursor Polymer of Structure (IIIa; G=acetyl)

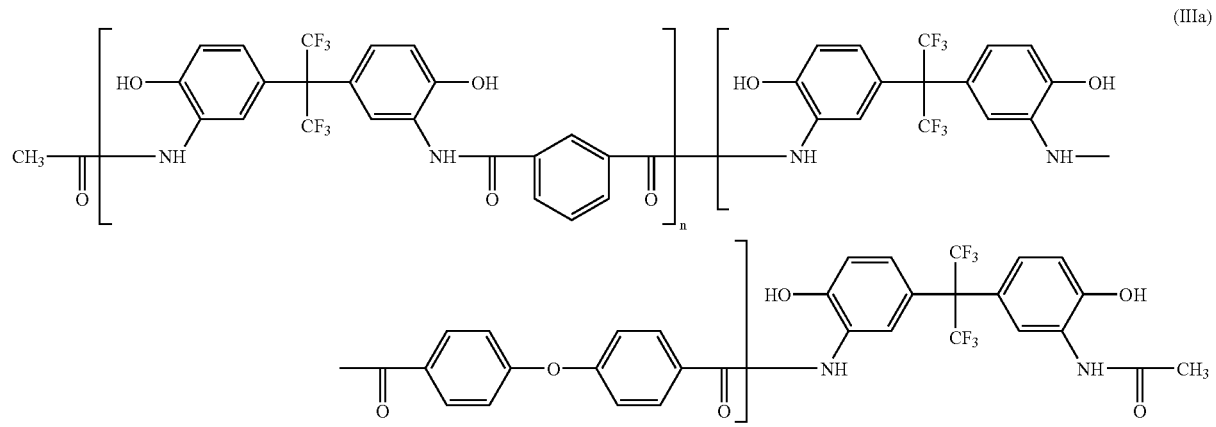

(IIIa)

3 small batches of PBO precursor polymers synthesized according to Synthesis Example 2 were mixed to obtain 100 g (184.5 mmol) PBO precursor mixture with inherent viscosity of 0.205 dL/g. The mixture was dissolved in 1000 g of diglyme. Residual water was removed as an azeotrope with diglyme using a rotary evaporator at 65° C. (10-12 torr). About 500 g of solvents was removed during the azeotrope distillation.

The reaction solution was transferred to a 1000 mL, three neck, round bottom flask equipped with $N_2$ inlet and magnetic stirrer. The reaction mixture cooled on ice bath down to about 5° C. Acetyl chloride (3.3 ml, 3.6 g) was added via syringe over the period of 5 min keeping reaction solution well stirred.

The reaction was held on ice bath for about 10 min. Then the ice bath was removed and the reaction was allowed to warm up over the period of 1 hr. Then, the mixture was again cooled to 5° C. on the ice bath. Pyridine (3.7 ml, 3.6 g) was added via syringe over the period of 1 hr. Reaction was kept on the ice bath for 10 min, and then was allowed to warm up over the period of 1 hr.

The reaction mixture was precipitated into 6 L of water. The polymer was collected by filtration and air dried overnight. Then, the polymer was dissolved in 500-600 g of acetone and precipitated into 6 L of water/methanol (70/30). The polymer was again collected by filtration and air-dried for several hours. The wet polymer cake was dissolved in a mixture 700 g of THF and was precipitated in 7 L of water, filtered, air-dried overnight followed by 24 hr drying in vacuum oven at 90° C.

Terminal $NH_2$ groups have a chemical shift of 4.5 ppm. After the reaction of acetyl chloride and polybenzoxazole precursor polymer was completed, it was observed that this peak was completely vanished, indicative that all $NH_2$ groups were reacted.

SYNTHESIS EXAMPLE 6

Synthesis of a Polybenzoxazole Precursor Polymer of Structure (Iva); G=acetyl

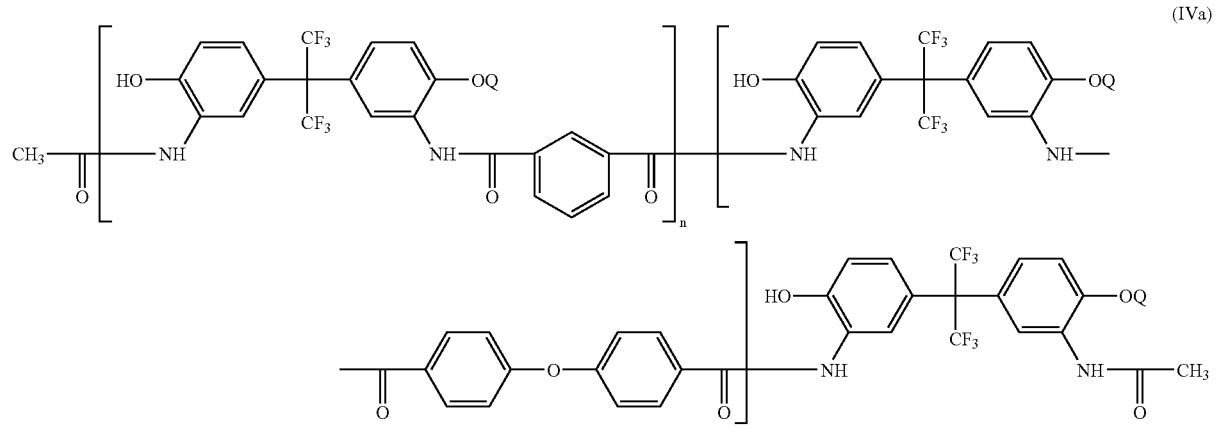

(IVa)

To a 1 L three-necked round bottom flask equipped with a mechanical stirrer, 67.5 g (approximately 120 mmol) of a mixture of two batches of polymer synthesized according to Synthesis Example 5 and 650 g of tetrahydrofuran (THF) were added. The mixture was stirred for ten minutes and the solid was fully dissolved. 1.01 g (0.38 mmole) of 2,1-naphthoquinonediazide-5-sulfonyl chloride (IId R=H) was then added and the mixture was stirred for another 10 minutes. Triethylamine, 0.39 g (3.9 mmol) mixed with 50 mL THF was added gradually within 30 minutes and then the reaction mixture was stirred for overnight. The reaction mixture was then added gradually to 3 L of vigorously stirred de-ionized water. The precipitated product was separated by filtration and reslurried twice, each time with 3 L of de-ionized water. After filtration the product was washed with 2 L de-ionized water. The isolated product was dried at 40° C. overnight. The yield of product was 84%.

SYNTHESIS EXAMPLE 7

Synthesis of a Polymer of Structure (IVb); G=phthaloyl Via an Alternative Embodiment To a 1 L three-necked round bottom flask equipped with a mechanical stirrer, and nitrogen inlet 100 g (165.9 mmol) of the polymer obtained in Synthesis Example 4 and 290 g of diglyme were added. The mixture was stirred for about 25 minutes and the solid was fully dissolved. 6.5 g (43.9 mmole) of phthalic anhydride was then added portion-wise within an hour at room temperature and the mixture was stirred for 16 hours. The reaction mixture was then added gradually to 5200 mL of vigorously stirred de-ionized water during a 60 minutes period. The precipitated product was separated by filtration and washed with 2000 mL of de-ionized water. To the product was added another 4000 mL de-ionized water and the mixture vigorously stirred for 30 minutes. After filtration the product was washed with 2000 mL de-ionized water. The isolated product was dried at 40° C. overnight. The yield of product was 90%.

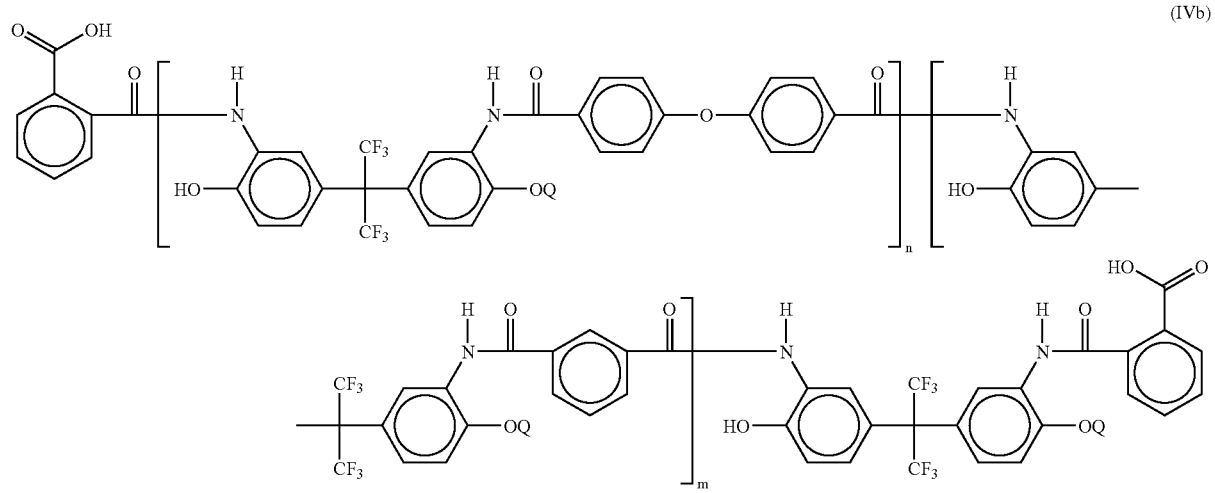

(IVb)

SYNTHESIS EXAMPLE 8

Preparation of Polybenzoxazole Precursor Polymer of Structure (Ib)

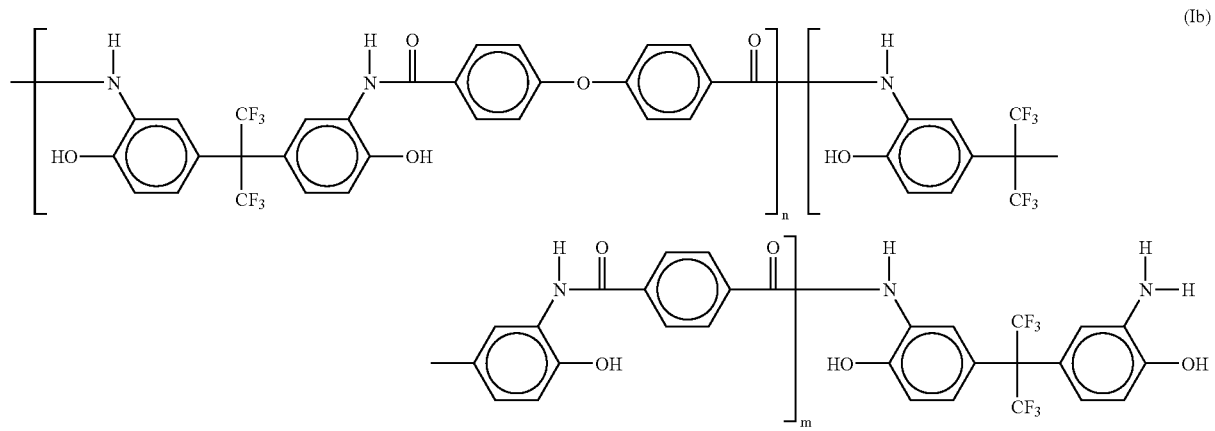

(Ib)

To a 20 L reactor equipped with a mechanical agitator, nitrogen inlet and thermocouple, 1500 g (4.09 mol) of hexafluoro-2,2-bis(3-amino-4-hydroxyphenyl)propane, 622 g (7.86 mol) of pyridine and 7250 g of N-methyl-2-pyrrolidone (NMP) were added. The solution was stirred at room temperature until all solids dissolved and then cooled in an ice water bath at 0-5° C. To this solution, 291 g g (1.43 mol) of terephthaloyl chloride and 634.5 g (2.15 mol) of 1,4-oxydibenzoyl chloride dissolved in 2760 g of NMP was added by using a diaphragm pump and Teflon transfer lines. The pump and Teflon transfer lines were cleaned by using 200 g of NMP. After the addition was completed, the resulting mixture was stirred at room temperature for 18 hours. The viscous solution was precipitated in 140 L of vigorously stirred de-ionized water. The polymer was collected by filtration and washed with 35 L of de-ionized water and a water/methanol (50/50) mixture. The polymer was dried under vacuum at 75° C. for 24 hours. The yield was almost quantitative and the inherent viscosity of the polymer was 0.183 dL/g measured in NMP at the concentration of 0.5 g/dL at 25° C.

Synthesis Example 3 was repeated except the polymer from Synthesis Example 8 was employed and the ratio of 2,1-naphthoquinonediazide-5-sulfonyl chloride to the total number of OH groups of the polymer was changed to 0.02. The yield was 96% and the inherent viscosity of the polymer was 0.201 dL/g measured in NMP at the concentration of 0.5 g/dL at 25° C.

SYNTHESIS EXAMPLE 9

Preparation of a Polybenzoxazole Precursor Polymer of Structure (IIb)

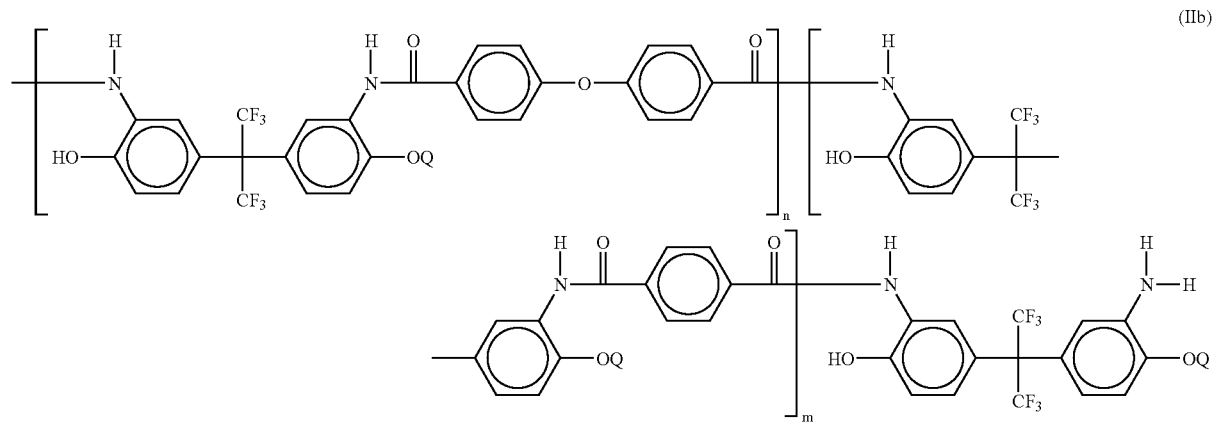

(IIb)

SYNTHESIS EXAMPLE 10

Synthesis of Polymer of Structure (IIIb); G=Acetyl

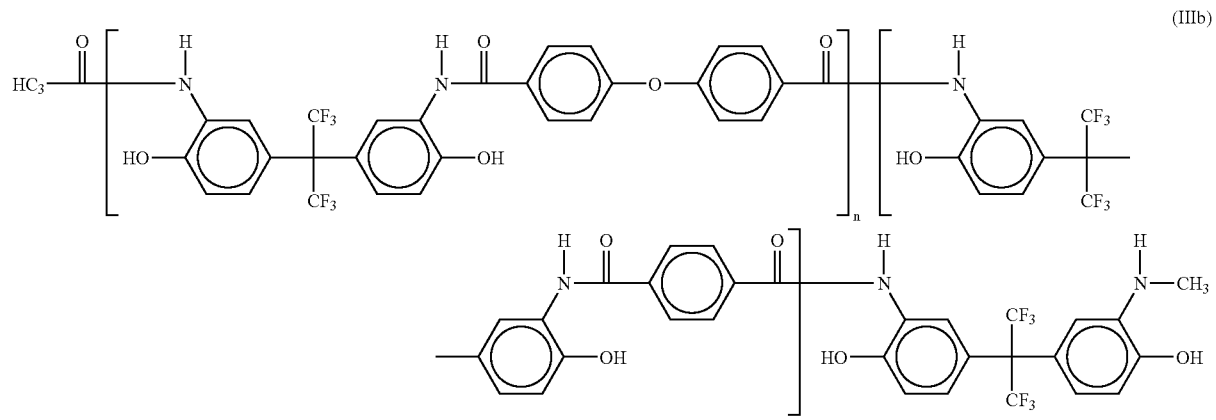

(IIIb)

Synthesis Example 5 was repeated except the polymer employed was the one prepared in Synthesis Example 8. The yield was 83.7% and the inherent viscosity of the polymer was 0.205 dL/g measured in NMP at the concentration of 0.5 g/dL at 25° C.

SYNTHESIS EXAMPLE 11

Synthesis of Polymer of Structure (IVb); G=Acetyl

To a 20 L reactor equipped with a mechanical agitator, nitrogen inlet and thermocouple, 1500 g (4.09 mol) of hexafluoro-2,2-bis(3-amino-4-hydroxyphenyl)propane, 622 g (7.86 mol) of pyridine and 5000 g of N-methyl-2-pyrrolidone (NMP) were added. The solution was stirred at room temperature until all solids dissolved and then cooled in an ice water bath at 0-5° C. To this solution, 212.09 g (1.04 mol) of terephthaloyl chloride, 212.0 g g (1.04 mol) of isophthaloyl chloride and 411.0 g (1.39 mol) of 1,4-oxydibenzoyl chloride dissolved in 2960 g of NMP were added by using a diaphragm

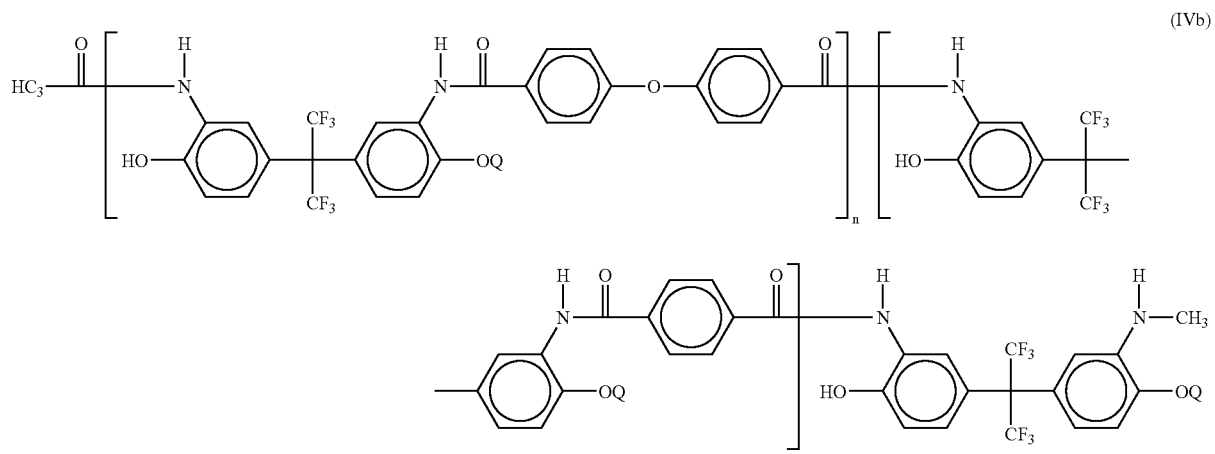

(IVb)

Synthesis Example 4 was repeated except the polymer used was one synthesized in Synthesis Example 10 and the ratio of 2,1-naphthoquinonediazide-5-sulfonyl chloride (IId R=H) to OH groups of the polymer was changed to 2.0/100. The yield was 96% and the inherent viscosity of the polymer was 0.204 dL/g measured in NMP at the concentration of 0.5 g/dL at 25° C.

SYNTHESIS EXAMPLE 12

Preparation of a Polybenzoxazole Precursor Polymer of Structure (Ic)

pump and Teflon transfer lines. The pump and Teflon transfer lines were cleaned using 200 g of NMP, which was then added to the solution. After the addition was completed, the resulting mixture was stirred at room temperature for 18 hours. The viscous solution was precipitated in 140 L of vigorously stirred de-ionized water. The polymer was collected by filtration and washed with 35 L of de-ionized water and a water/methanol (50/50) mixture. The polymer was dried under vacuum at 75° C. for 24 hours. The yield was almost quantitative and the inherent viscosity of the polymer was 0.205 dL/g measured in NMP at the concentration of 0.5 g/dL at 25° C.

(Ic)

SYNTHESIS EXAMPLE 13

Synthesis of a Polybenzoxazole Polymer Precursor of Structure (IIc)

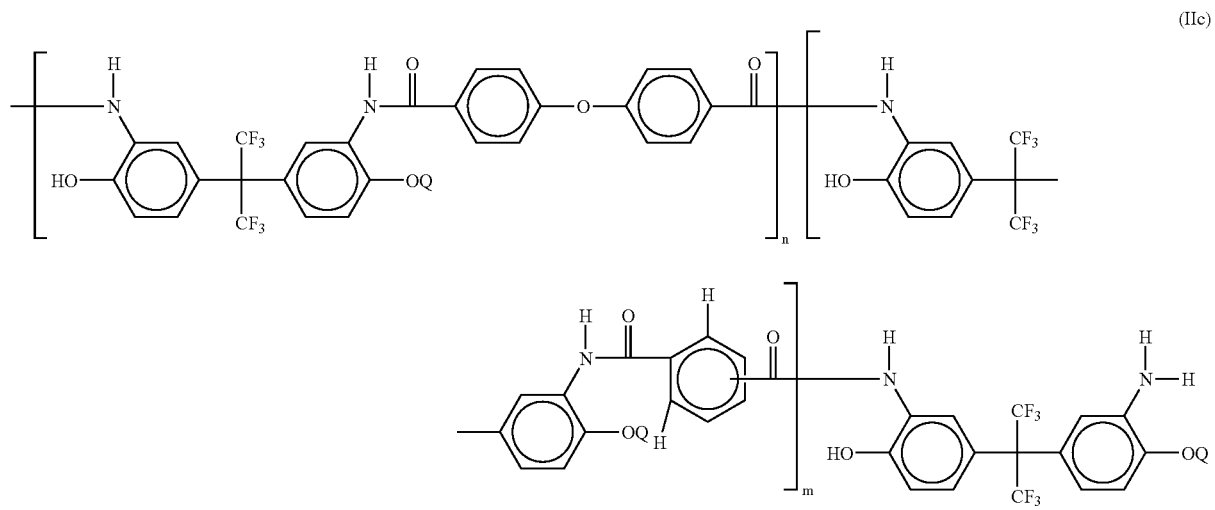

(IIc)

Synthesis Example 3 was repeated except the polymer from Synthesis Example 12 was employed and the ratio of 2,1-naphthoquinonediazide-5-sulfonyl chloride to the total number of OH groups of the polymer was changed to 0.025. The yield was 96% and the inherent viscosity of the polymer was 0.201. dL/g measured in NMP at the concentration of 0.5 g/dL at 25° C.

SYNTHESIS EXAMPLE 14

Synthesis of Polymer of Structure (IIIc); G=Acetyl

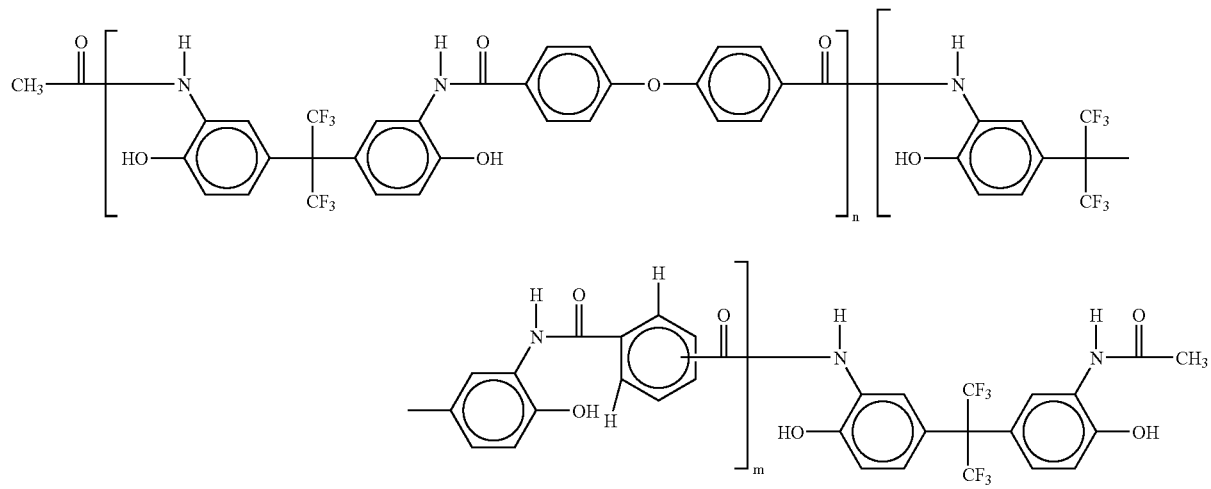

Synthesis Example 5 was repeated except the polymer used was one prepared in Synthesis Example 12. The yield was 93.6% and the inherent viscosity of the polymer was 0.212 dL/g measured in NMP at the concentration of 0.5 g/dL at 25° C.

SYNTHESIS EXAMPLE 15

Synthesis of Polymer of Structure (IVc); G=Acetyl

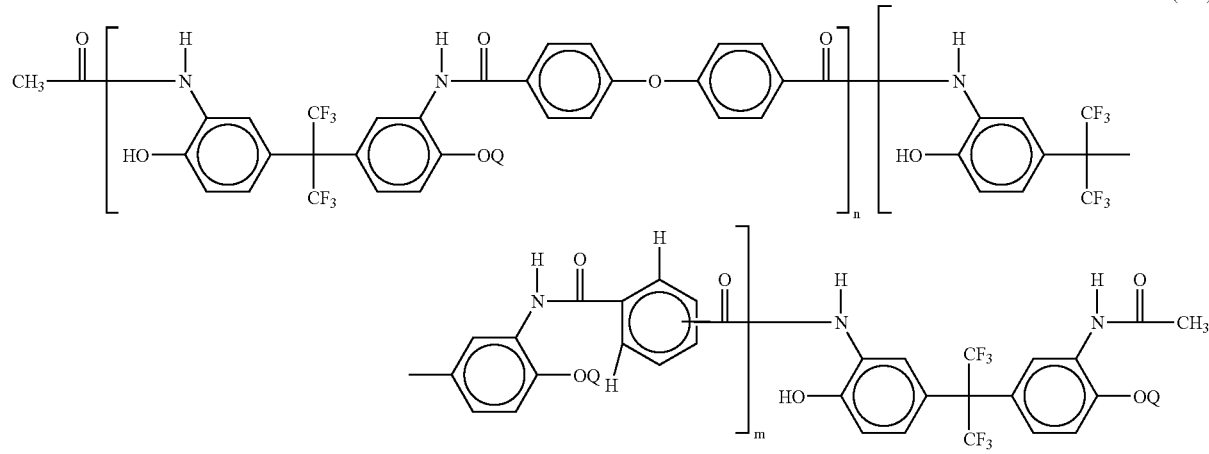

Synthesis Example 4 was repeated except the polymer employed was the one prepared in Synthesis Example 14 and the ratio of 2,1-naphthoquinonediazide-5-sulfonyl chloride (IId R=H) to OH groups of the polymer was changed to 3.0/100. The yield was 98.7% and the inherent viscosity of the polymer was 0.206 dL/g measured in NMP at the concentration of 0.5 g/dL at 25° C.

SYNTHESIS EXAMPLE 16

Synthesis of a Photoactive Compound (PAC) of Structure (VIII p)

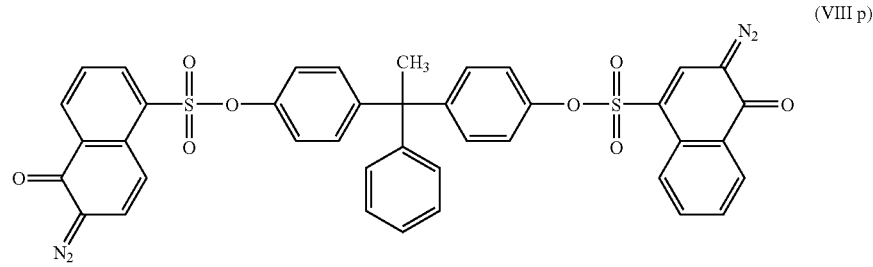

To a 500 mL, 3-neck flask equipped with mechanical stirrer, dropping funnel, pH probe, thermometer and nitrogen purge system were added 225 mL of THF and 30 g of (4,4'-(1-phenylethylidene)bisphenol), Bisphenol AP. The mixture was stirred until bisphenol AP was fully dissolved. To this was added 27.75 g of 4-naphthoquinone diazide sulfonyl chloride and 25 mL of THF. The reaction mixture was stirred until the solid was fully dissolved. 10.475 g of triethylamine dissolved in 50 mL THF was added to the reaction mixture gradually while the pH was kept under 8 during this process. The temperature during this exothermic reaction was kept under 30° C. Upon completion of addition, the reaction mixture was stirred for 48 hours. To this was added 27.75 g of 5-naphthoquinone diazide sulfonyl chloride and 25 mL of THF and the reaction mixture was stirred for 30 minutes. 10.475 g triethylamine dissolved in 50 mL THF was added to the reaction mixture gradually while the pH was kept under 8 during this process. Again during this exothermic reaction the temperature was kept under 30° C. Upon completion of the addition, the reaction mixture was stirred for 20 hours. The reaction mixture was then added gradually to a mixture of 6 L of Dl-water and 10 g of HCl. The product was filtered and washed with 2 L of de-ionized water. The product was then reslurried by using 3 L of de-ionized water, filtered and washed with 1 L Of de-ionized water. The product was then dried inside a vacuum oven at 40° C. until the amount of water dropped below 2%. HPLC analysis revealed that the product is mixture of several esters as shown in Table 1.

SYNTHESIS EXAMPLE 17

Synthesis of a Photoactive Compound (PAC) of Structure (VIII p) Using Different Ratio of 4-naphthoquinone Diazide Sulfonyl Chloride to 5-naphthoquinone Diazide Sulfonyl Chloride Synthesis example 16 was repeated except the ratio of 4-naphthoquinone diazide sulfonyl chloride to 5-naphthoquinone diazide sulfonyl chloride was changed from 1/1 to 1/3. HPLC analysis revealed that the product is mixture of several esters as shown in Table 1. The total yield of this reaction was 91.7%

SYNTHESIS EXAMPLE 18

Synthesis of a Photoactive Compound (PAC) of Structure (VIII p) Using Different Ratio of 4-naphthoquinone Diazide Sulfonyl Chloride to 5-naphthoquinone Diazide Sulfonyl Chloride Synthesis Example 16 was repeated except the ratio of 4-naphthoquinone diazide sulfonyl chloride to 5-naphthoquinone diazide sulfonyl chloride was changed from 1/1 to 3/1. HPLC analysis revealed that the product is mixture of several esters as shown in Table 1. The total yield of this reaction was 88.0%.

TABLE 1

| Structure | Compound | Example 16 | Example 17 | Example 18 |
|---|---|---|---|---|
| (naphthoquinone diazide-5-sulfonyl chloride) | S214 | 0.61% | 0.12 | 0.21 |
| (naphthoquinone diazide-4-sulfonyl chloride) | S215 | 0.53% | 0.26 | 0.11 |
| (bisphenol monoester with S214) | S214 monoester | 1.72% | 0.30 | 2.73 |
| (bisphenol monoester with S215) | S215 monoester | 1.4% | 0.62 | 0.68 |
| (bisphenol diester with S215) | S215 diester | 18.9% | 50.3 | 4.50 |
| (mixed ester PAC structure) | Mixed Ester PAC | 46.7% | 39.9 | 32.6 |

TABLE 1-continued

| Structure | Compound | Example 16 | Example 17 | Example 18 |
|---|---|---|---|---|
| 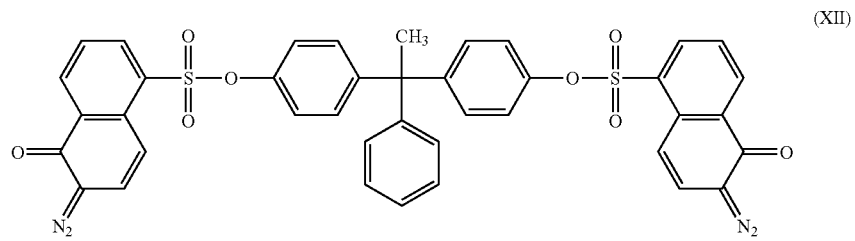 | S214 diester | 29% | 8.00 | 58.3 |

The solubility of this compound on GBL was tested and it was more than 18%

COMPARATIVE SYNTHESIS EXAMPLE 1

Synthesis of a Photoactive Compound (PAC) of Structure (XII)

(XII)

The reaction was similar to that of Example 17 except only 5-naphthoquinone diazide sulfonyl chloride was used. HPLC analysis revealed that about 94% of the product was diester and 6% was monoester. The solubility of this compound in GBL was about 10%

COMPARATIVE SYNTHESIS EXAMPLE 2

Synthesis of a Photoactive Compound (PAC) of Structure (XIII)

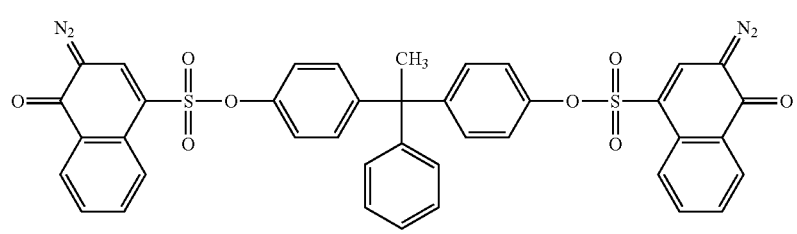

(XIII)

The reaction was similar to that of Synthesis Example 17 except only 4-naphthoquinone diazide sulfonyl chloride was used. HPLC analysis revealed that about 87% of the product is diester and 13% is monoester. The solubility of this compound on GBL was tested and it was only about 2-3%.

EXAMPLE 1

Lithographic Evaluation of a Photosensitive Composition Based on a PAC with Structure (VIII p)

100 parts polymer obtained in Synthesis Example 4, 11.9 part of bis phenol AP PAC obtained from example 16, 5 parts of diphenylsilane diol and 3 parts of gamma-ureidopropyltrimethoxysilane (adhesion promoter) was dissolved in GBL and filtered. The formulation was spin coated on a silicon wafer then baked on a hotplate for 4 minutes at 120° C., resulting in a film thickness of 14.01 μm. The film was then exposed utilizing an i-line stepper in an open frame exposure array, which incrementally increased exposure energy 10 mJ/cm$^2$ with a starting exposure energy of 400 mJ/cm$^2$. The wafer was then developed with two 50 second puddles with a 0.262N aqueous solution of tetra-methyl ammonium hydroxide, resulting in a array of exposed boxes that were either clear of or containing residue. These boxes were visually inspected for what was exposure energy at which residue were completely cleared from the exposed area. The formulation cleared boxes at a dose of 495 mJ/cm$^2$. The unexposed film thickness decreased 6.15 microns to 7.85 microns (43.97% Film thickness loss).

EXAMPLE 2

Lithographic Evaluation of a Photosensitive Composition Based on a PAC with Structure (VIII p)

The photosensitive composition of Example 1 was spin coated on a silicon wafer and baked on a hotplate for 4 minutes at 120° C., resulting in a film thickness of 14.05 μm. The film was then exposed utilizing an i-line stepper in an open frame exposure array, which incrementally increased exposure energy 10 mJ/cm$^2$ with a starting exposure energy of 600 mJ/cm$^2$. The wafer was then developed with two 40 second puddles. The formulation cleared boxes at a dose of 670 mJ/cm$^2$. The unexposed film thickness decreased 5.13 microns to 8.92 microns (36.51% Film thickness loss).

EXAMPLE 3

Lithographic Evaluation of a Photosensitive Composition Based on a PAC with Structure (VIII p)

The photosensitive composition of Example 1 was spin coated on a silicon wafer then baked on a hotplate for 4 minutes at 120° C., resulting in a film thickness of 14.03 μm. The film was then exposed utilizing an i-line stepper in an open frame exposure array, which incrementally increased exposure energy 10 mJ/cm$^2$ with a starting exposure energy of 800 mJ/cm$^2$. The wafer was then developed with two 28 second puddles. The formulation cleared boxes at a dose of 950 mJ/cm$^2$. The unexposed film thickness decreased 3.98 microns to 10.05 microns (28.37% Film thickness loss).

EXAMPLE 4

Lithographic Evaluation of a Photosensitive Composition

Based on a PAC with Structure (VIII p)

The photosensitive composition of Example 1 was spin coated on a silicon wafer then baked on a hotplate for 4 minutes at 120° C., resulting in a film thickness of 13.91 μm. The film was then exposed utilizing an i-line stepper in an open frame exposure array, which incrementally increased exposure energy 50 mJ/cm$^2$ with a starting exposure energy of 300 mJ/cm$^2$. The wafer was then developed with two 41.5 second puddles. The formulation cleared boxes at a dose of 650 mJ/cm$^2$. The unexposed film thickness decreased 5.33 microns to 8.58 microns (38.32% Film thickness loss).

COMPARATIVE EXAMPLE 1

Lithographic Evaluation of a Photosensitive Composition Based on a PAC with Structure (XII)

100 parts polymer obtained in Synthesis Example 4, 11.9 part of bis phenol AP PAC shown in structure XII (see Comparative Synthesis Example 1), 5 parst of diphenylsilane diol and 3 parts of gamma-ureidopropyltrimethoxysilane (adhesion promoter) was dissolved in GBL and filtered. The formulation was spin coated on a silicon wafer then baked on a hotplate for 4 minutes at 120° C., resulting in a film thickness of 14.17 μm. The film was then exposed utilizing an i-line stepper in an open frame exposure array, which incrementally increased exposure energy 10 mJ/cm$^2$ with a starting exposure energy of 400 mJ/cm$^2$. The wafer was then developed with two 56 second puddles with a 0.262N aqueous solution of tetra-methyl ammonium hydroxide, resulting in a array of exposed boxes that were either clear of or containing residue. These boxes were visually inspected for what was exposure energy at which residue were completely cleared from the exposed area. The formulation cleared boxes at a dose of 440 mJ/cm$^2$. The unexposed film thickness decreased 7.3 microns to 6.87 microns (51.52% Film thickness loss).

COMPARATIVE EXAMPLE 2

Lithographic Evaluation of a Photosensitive Composition Based on a PAC with Structure (XII)

The photosensitive composition of Comparative Example 1 was spin coated on a silicon wafer then baked on a hotplate for 4 minutes at 120° C., resulting in a film thickness of 14.12 μm. The film was then exposed utilizing an i-line stepper in an open frame exposure array, which incrementally increased exposure energy 10 mJ/cm$^2$ with a starting exposure energy of 600 mJ/cm$^2$. The wafer was then developed with two 42 second puddles. The formulation cleared boxes at a dose of 640 mJ/cm$^2$. The unexposed film thickness decreased 5.68 microns to 8.44 microns (40.23% Film thickness loss).

COMPARATIVE EXAMPLE 3

Lithographic Evaluation of a Photosensitive Composition Based on a PAC with Structure (XII)

The photosensitive composition of Comparative Example 1 was spin coated on a silicon wafer then baked on a hotplate for 4 minutes at 120° C., resulting in a film thickness of 14.07 μm. The film was then exposed utilizing an i-line stepper in an open frame exposure array, which incrementally increased exposure energy 10 mJ/cm$^2$ with a starting exposure energy of 800 mJ/cm$^2$. The wafer was then developed with two 34 second puddles. The formulation cleared boxes at a dose of 825 mJ/cm$^2$. The unexposed film thickness decreased 4.82 microns to 9.25 microns (34.26% Film thickness loss).

COMPARATIVE EXAMPLE 4

Lithographic Evaluation of a Photosensitive Composition Based on a PAC with Structure (XII)

The photosensitive composition of Comparative Example 1 was spin coated on a silicon wafer then baked on a hotplate for 4 minutes at 120° C., resulting in a film thickness of 14.18 μm. The film was then exposed utilizing an i-line stepper in an open frame exposure array, which incrementally increased exposure energy 50 mJ/cm$^2$ with a starting exposure energy of 300 mJ/cm$^2$. The wafer was then developed with two 41.5 second puddles. The formulation cleared boxes at a dose of 700 mJ/cm$^2$. The unexposed film thickness decreased 5.66 microns to 8.62 microns (39.92% Film thickness loss).

The results of Example 1-4 and comparative Example of 1-4 are shown in FIG. 1. From these results it is obvious that the composition used in Examples 1-4 have a better film thickness retention at the same energy dose in compare with the composition used in Comparative Examples 1-4.

EXAMPLE 5

Lithographic Evaluation of a Photosensitive Composition Based on a PAC with Structure (VIII p)

100 parts polymer obtained in Synthesis Example 4, 11.9 part of bis phenol AP PAC obtained from example 17, 5 part of diphenylsilane diol and 3 parts of gamma-ureidopropyltrimethoxysilane was dissolved in GBL and filtered. The formulation was spin coated on a silicon wafer then baked on a hotplate for 4 minutes at 120° C., resulting in a film thickness of 14.15 μm. The film was then exposed utilizing an i-line stepper in an open frame exposure array, which incrementally increased exposure energy 20 mJ/cm$^2$ with a starting exposure energy of 300 mJ/cm$^2$. The wafer was then developed with two 45 second puddles with a 0.262N aqueous solution of tetra-methyl ammonium hydroxide, resulting in a array of exposed boxes that were either clear of or containing residue. These boxes were visually inspected for what was exposure energy at which residue were completely cleared from the exposed area. The formulation cleared boxes at a dose of 485 mJ/cm$^2$. The unexposed film thickness decreased 6.71 microns to 7.43 microns (47.44% Film thickness loss).

EXAMPLE 6

Lithographic Evaluation of a Photosensitive Composition Based on a PAC with Structure (VIII p)

The photosensitive composition of Example 5 was spin coated on a silicon wafer and baked on a hotplate for 4 minutes at 120° C., resulting in a film thickness of 14.11 μm. The film was then exposed utilizing an i-line stepper in an open frame exposure array, which incrementally increased exposure energy 20 mJ/cm$^2$ with a starting exposure energy of 500 mJ/cm$^2$. The wafer was then developed with two 33 second puddles. The formulation cleared boxes at a dose of 680 mJ/cm$^2$. The unexposed film thickness decreased 5.30 microns to 8.81 microns (37.57% Film thickness loss).

EXAMPLE 7

Lithographic Evaluation of a Photosensitive Composition Based on a PAC with Structure (VIII p)

The photosensitive composition of Example 5 was spin coated on a silicon wafer then baked on a hotplate for 4 minutes at 120° C., resulting in a film thickness of 14.14 μm. The film was then exposed utilizing an i-line stepper in an open frame exposure array, which incrementally increased exposure energy 20 mJ/cm$^2$ with a starting exposure energy of 800 mJ/cm$^2$. The wafer was then developed with two 28 second puddles. The formulation cleared boxes at a dose of 920 mJ/cm$^2$. The unexposed film thickness decreased 4.19 microns to 9.95 microns (29.63% Film thickness loss).

From the results of Example 5-7 and comparative Example of 1-4 it is obvious that the composition used in Examples 5-7 have a better film thickness retention at the same energy dose in comparison with the composition used in Comparative Examples 1-4.

EXAMPLE 8

Lithographic Evaluation of a Photosensitive Composition Based on a PAC with Structure (VIII p)

100 parts polymer obtained in Synthesis Example 4, 11.9 part of bis phenol AP PAC obtained from example 18, 5 part of diphenylsilane diol and 3 parts of gamma-ureidopropyltrimethoxysilane was dissolved in GBL and filtered. The formulation was spin coated on a silicon wafer then baked on a hotplate for 4 minutes at 120° C., resulting in a film thickness of 14.09 μm. The film was then exposed utilizing an i-line stepper in an open frame exposure array, which incrementally increased exposure energy 20 mJ/cm$^2$ with a starting exposure energy of 800 mJ/cm$^2$. The wafer was then developed with two 22 second puddles with a 0.262N aqueous solution of tetra-methyl ammonium hydroxide, resulting in a array of exposed boxes that were either clear of or containing residue. These boxes were visually inspected for what was exposure energy at which residue were completely cleared from the exposed area. The formulation cleared boxes at a dose of 860 mJ/cm$^2$. The unexposed film thickness decreased 4.06 microns to 10.02 microns (28.84% Film thickness loss).

EXAMPLE 9

Lithographic Evaluation of a Photosensitive Composition Based on a PAC with Structure (VIII p)

The photosensitive composition of Example 8 was spin coated on a silicon wafer and baked on a hotplate for 4 minutes at 120° C., resulting in a film thickness of 14.09 μm. The film was then exposed utilizing an i-line stepper in an open frame exposure array, which incrementally increased exposure energy 20 mJ/cm$^2$ with a starting exposure energy of 500 mJ/cm$^2$. The wafer was then developed with two 30 second puddles. The formulation cleared boxes at a dose of 640 mJ/cm$^2$. The unexposed film thickness decreased 5.11 microns to 8.99 microns (36.23% Film thickness loss).

EXAMPLE 10

Lithographic Evaluation of a Photosensitive Composition Based on a PAC with Structure (VIII p)

The photosensitive composition of Example 8 was spin coated on a silicon wafer then baked on a hotplate for 4 minutes at 120° C., resulting in a film thickness of 14.11 μm. The film was then exposed utilizing an i-line stepper in an open frame exposure array, which incrementally increased exposure energy 20 mJ/cm$^2$ with a starting exposure energy of 300 mJ/cm$^2$. The wafer was then developed with two 28 second puddles. The formulation cleared boxes at a dose of 420 mJ/cm$^2$. The unexposed film thickness decreased 6.66 microns to 7.45microns (47.21% Film thickness loss).

From the results of Example 8-10 and comparative Example of 1-4 it is obvious that the composition used in Examples 8-10 have a better film thickness retention at the same energy dose in comparison with the composition used in Comparative Examples 1-4.

EXAMPLE 11

Lithographic Evaluation of a Photosensitive Composition Based on a PAC with Structure (VIII p).

100 parts polymer obtained in Synthesis Example 4, 14.3 parts of bis phenol AP PAC obtained from Synthesis Example 16, 2.5 parts of diphenylsilane diol and 1.4 parts of gamma-ureidopropyltrimethoxysilane (adhesion promoter) were dissolved in GBL and filtered. The formulation was spin coated on a silicon wafer then baked on a hotplate for 4 minutes at 120° C., resulting in a film thickness of 14.07 µm. The film was then exposed utilizing an i-line stepper in an open frame exposure array, which incrementally increased exposure energy 50 mJ/cm² with a starting exposure energy of 300 mJ/cm². The wafer was then developed with two 41.5 second puddles with a 0.262N aqueous solution of tetramethyl ammonium hydroxide, resulting in a array of exposed boxes that were either clear of or containing residue. These boxes were visually inspected for what was exposure energy at which residue were completely cleared from the exposed area. The formulation cleared boxes at a dose of 800 mJ/cm². The unexposed film thickness decreased 4.59 to 9.48 microns (32.62% Film thickness loss).

COMPARATIVE EXAMPLE 5

Composition Based on a PAC with Structure (XIII)

Attempts to prepare a composition containing 100 parts polymer obtained in Synthesis Example 4, 11.9 parts of bis phenol AP PAC shown in structure (XIII; see Comparative Synthesis Example 2), 5 parts of diphenylsilane diol and 3 parts of gamma-ureidopropyltrimethoxysilane (adhesion promoter) dissolved in GBL failed due to lack of solubility of PAC (XIII).

EXAMPLE 12

Lithographic Evaluation of a Photosensitive Composition Based on a PAC with Structure (VIII p)

100 parts polymer obtained in Synthesis Example 9, 21 parts PAC obtained from Synthesis Example 16 and 1.5 part of gamma-glycidoxypropyltrimethoxysilane was dissolved in NMP and filtered. The formulation was spin coated on a silicon wafer then baked on a hotplate for 4 minutes at 120° C., resulting in a film thickness of 14.21 µm. The film was then exposed utilizing an i-line stepper in an open frame exposure array, which incrementally increased exposure energy 25 mJ/cm² with a starting exposure energy of 700 mJ/cm². The wafer was then developed with two 40 second puddles with a 0.262N aqueous solution of tetra-methyl ammonium hydroxide, resulting in a array of exposed boxes that were either clear of or containing residue. These boxes were visually inspected for what was exposure energy at which residue were completely cleared from the exposed area. The formulation cleared boxes at a dose of 1100 mJ/cm². The unexposed film thickness decreased 6.85 microns to 7.36 microns (48.21% Film thickness loss).

EXAMPLE 13

Lithographic Evaluation of a Photosensitive Composition Based on a PAC with Structure (VIII p)

100 parts polymer obtained in Synthesis Example 13, 21 parts of PAC obtained from Synthesis Example 16, 2.5 part of diphenylsilane diol and 5 part of gamma-mercaptopropyl-trmiethoxysilane was dissolved in NMP and filtered. The formulation was spin coated on a silicon wafer then baked on a hotplate for 4 minutes at 120° C., resulting in a film thickness of 16.76 µm. The film was then exposed utilizing an i-line stepper in an open frame exposure array, which incrementally increased exposure energy 50 mJ/cm² with a starting exposure energy of 100 mJ/cm². The wafer was then developed with two 70 second puddles with a 0.262N aqueous solution of tetra-methyl ammonium hydroxide, resulting in a array of exposed boxes that were either clear of or containing residue. These boxes were visually inspected for what was exposure energy at which residue were completely cleared from the exposed area. The formulation cleared boxes at a dose of 500 mJ/cm². The unexposed film thickness decreased 9.72 microns to 7.04 microns (57.98% Film thickness loss).

EXAMPLE 14

Lithographic Evaluation of a Photosensitive Composition Based on a PAC with Structure (VIII p)

100 parts polymer obtained in Synthesis Example 7, 13.5 parts of PAC obtained from Synthesis Example 16, 1.98 part of diphenylsilane diol and 1.53 part of gamma-Ureidopropyltrimethoxysilane was dissolved in GBL and filtered. The formulation was spin coated on a silicon wafer then baked on a hotplate for 4 minutes at 120° C., resulting in a film thickness of 13.99 µm. The film was then exposed utilizing an i-line stepper in an open frame exposure array, which incrementally increased exposure energy 10 mJ/cm² with a starting exposure energy of 440 mJ/cm². The wafer was then developed with two 30 second puddles with a 0.262N aqueous solution of tetra-methyl ammonium hydroxide, resulting in a array of exposed boxes that were either clear of or containing residue. These boxes were visually inspected for what was exposure energy at which residue were completely cleared from the exposed area. The formulation cleared boxes at a dose of 520 mJ/cm². The unexposed film thickness decreased 5.70 microns to 8.29 microns (40.73% Film thickness loss).

SYNTHESIS EXAMPLE 19

Synthesis of a Photoactive Compound (PAC) of Structure (VIIIo)

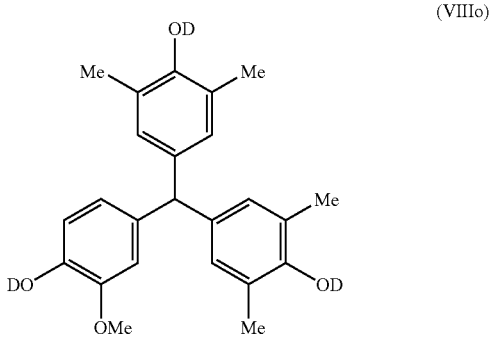

(VIIIo)

To a 500 mL, 3-neck flask equipped with mechanical stirrer, dropping funnel, pH probe, thermometer and nitrogen purge system were added 150 mL of THF and 15.14 g of bis(3,5-dimethyl-4-hydroxyphenyl)-3-methoxy-4-hydroxyphenylmethane. The mixture was stirred until the backbone was fully dissolved. To this was added 9.028 g of 4-naphthoquinone diazide sulfonyl chloride and 10 mL of THF. The reaction mixture was stirred until the solid was fully dissolved. 3.732 g of triethylamine dissolved in 10 mL THF was added to the reaction mixture gradually while the pH was kept under 8 during this process. The temperature during this exothermic reaction was kept under 30° C. Upon completion of addition, the reaction mixture was stirred for 24 hours. At this point HPLC showed that 6.5% of S-214 was not reacted. To the mixture was added 2.5 g of triethylamine and 10 mL of THF. Upon completion of addition, the reaction mixture was stirred for another 24 hours To this was added 16.76 g of 5-naphthoquinone diazide sulfonyl chloride and 10 mL of THF and the reaction mixture was stirred for 30 minutes. 5.0 g triethylamine dissolved in 10 mL THF was added to the reaction mixture gradually while the pH was kept under 8 during this process. Again during this exothermic reaction the temperature was kept under 30° C. Upon completion of the addition, the reaction mixture was stirred for 20 hours. At this point HPLC showed that 4.9% of S-215 was not reacted. To the mixture was added 2.5 g of triethylamine and 10 mL of THF. Upon completion of addition, the reaction mixture was stirred for another 24 hours. The reaction mixture was then added gradually to a mixture of 4 L of DI-water and 10 g of HCl. The product was filtered and washed with 1 L of de-ionized water. The product was then reslurried by using 2.5 L of de-ionized water, filtered and washed with 1 L Of de-ionized water. The product was then dried inside a vacuum oven at 40° C. until the amount of water dropped below 2%. HPLC analysis revealed that the product was a mixture of esters as shown in Table 2.

TABLE 2

| Structure | Amount |
|-----------|--------|
| | 2.41% |
| | 8.11% |
| | 10.48% |

TABLE 2-continued

| Structure | Amount |
|---|---|
| (structure) | 1.04% |
| (structure) | 32.09% |
| (structure) | 10.57% |

TABLE 2-continued

| Structure | Amount |
|---|---|
| [chemical structure] | 28.1% |
| [chemical structure] | 2.66 |

The total amount of DNQ on the backbone was about 2.22 mole per 1 mole of backbone. The composition of the reaction product was 10.5% monoesters, 43.6 diesters, and 41.33% triesters.

EXAMPLE 15

Lithographic Evaluation of a Photosensitive Composition Based on PAC (VIIIo)

100 parts polymer obtained in Synthesis Example 4, 17 parts of PAC VIIIo obtained in Synthesis Example 19, and 1 part of triethoxysilanepropylethylcarbamate were dissolved in GBL and filtered. The formulation was spin coated on a silicon wafer and then baked on a hotplate for 4 minutes at 120° C., resulting in a film thickness of 14.02 μm. The film was then exposed utilizing an i-line stepper in an open frame exposure array, which incrementally increased exposure energy 20 mJ/cm$^2$ with a starting exposure energy of 300 mJ/cm$^2$. The wafer was then developed with two 20 second puddles with a 0.262N aqueous solution of tetra-methyl ammonium hydroxide, resulting in a array of exposed boxes that were either clear of or containing residue. These boxes were visually inspected for what was exposure energy at which residue were completely cleared from the exposed area. The formulation cleared boxes at a dose of 664 mJ/cm$^2$.

The unexposed film thickness decreased 5.04 microns to 8.97 microns (36.01% Film thickness loss).

EXAMPLE 16

Lithographic Evaluation of a Photosensitive Composition Based on PAC (VIIIo)

The photosensitive composition of Example 15 was spin coated on a silicon wafer and then baked on a hotplate for 4 minutes at 120° C., resulting in a film thickness of 13.89 μm. The film was then exposed utilizing an i-line stepper in an open frame exposure array, which incrementally increased exposure energy 20 mJ/cm$^2$ with a starting exposure energy of 100 mJ/cm$^2$. The wafer was then developed with two 30 second puddles with a 0.262N aqueous solution of tetra-methyl ammonium hydroxide, resulting in a array of exposed boxes that were either clear of or containing residue. These boxes were visually inspected for what was exposure energy at which residue were completely cleared from the exposed area. The formulation cleared boxes at a dose of 364 mJ/cm$^2$. The unexposed film thickness decreased 6.82 microns to 7.07 microns (49.13% Film thickness loss).

EXAMPLE 17

Lithographic Evaluation of a Photosensitive Composition Based on PAC (VIIIo)

The photosensitive composition of Example 15 was spin coated on a silicon wafer and then baked on a hotplate for 4 minutes at 120° C., resulting in a film thickness of 14.00 μm. The film was then exposed utilizing an i-line stepper in an open frame exposure array, which incrementally increased exposure energy 20 mJ/cm$^2$ with a starting exposure energy of 100 mJ/cm$^2$. The wafer was then developed with two 35 second puddles with a 0.262N aqueous solution of tetra-methyl ammonium hydroxide, resulting in a array of exposed boxes that were either clear of or containing residue. These boxes were visually inspected for what was exposure energy at which residue were completely cleared from the exposed area. The formulation cleared boxes at a dose of 292 mJ/cm$^2$. The unexposed film thickness decreased 7.52 microns to 6.47 microns (53.75% Film thickness loss).

EXAMPLE 18

Lithographic Evaluation of a Photosensitive Composition Based on PAC (VIIIo)

Photosensitive composition of Example 15 was spin coated on a silicon wafer and then baked on a hotplate for 4 minutes at 120° C., resulting in a film thickness of 13.90 μm. The film was then exposed utilizing an i-line stepper in an open frame exposure array, which incrementally increased exposure energy 20 mJ/cm$^2$ with a starting exposure energy of 600 mJ/cm$^2$. The wafer was then developed with two 15 second puddles with a 0.262N aqueous solution of tetra-methyl ammonium hydroxide, resulting in a array of exposed boxes that were either clear of or containing residue. These boxes were visually inspected for what was exposure energy at which residue were completely cleared from the exposed area. The formulation cleared boxes at a dose of 852 mJ/cm$^2$. The unexposed film thickness decreased 4.17 microns to 9.73 microns (30.00% Film thickness loss).

COMPARATIVE SYNTHESIS EXAMPLE 3

Pac XIV was prepared by a method similar to that described in Comparative Synthesis Example 1. Analysis (see Table 3) showed that it was mixture composed of the following components.

TABLE 3

| Structure | Amount |
|---|---|
| (chemical structure) | 2.69% |

TABLE 3-continued

| Structure | Amount |
|---|---|
| [chemical structure: bis-DNQ sulfonate ester of methylated trisphenol with OMe and OH] | 27.60% |
| [chemical structure: tris-DNQ sulfonate ester of methylated trisphenol with OMe] | 62.77% |

The total amount of DNQ was 2.48 mole per 1 mole of backbone and contained 2.69% monoester, 27.6% diester, and 62.77% triester. Triesters are more effective in retaining unexposed film during lithography.

COMPARATIVE EXAMPLE 6

Lithographic Evaluation of a Photosensitive Composition Based on PAC (XIV)

100 parts polymer obtained in Synthesis Example 4, 17 parts of PAC XIV obtained in Comparative Synthesis Example 3, and 1 part of triethoxysilanepropylethylcarbamate were dissolved in GBL and filtered. The formulation was spin coated on a silicon wafer and then baked on a hotplate for 4 minutes at 120° C., resulting in a film thickness of 14.31 µm. The film was then exposed utilizing an i-line stepper in an open frame exposure array, which incrementally increased exposure energy 20 mJ/cm$^2$ with a starting exposure energy of 100 mJ/cm$^2$. The wafer was then developed with two 70 second puddles with a 0.262N aqueous solution of tetra-methyl ammonium hydroxide, resulting in a array of exposed boxes that were either clear of or containing residue. These boxes were visually inspected for what was exposure energy at which residue were completely cleared from the exposed area. The formulation cleared boxes at a dose of 300 mJ/cm$^2$. The unexposed film thickness decreased 7.75 microns to 6.56 microns (54.14% Film thickness loss).

COMPARATIVE EXAMPLE 7

Lithographic Evaluation of a Photosensitive Composition Based on PAC (XIV)

The photosensitive composition prepared in Comparative Example 6 was spin coated on a silicon wafer and then baked on a hotplate for 4 minutes at 120° C., resulting in a film thickness of 14.16 µm. The film was then exposed utilizing an i-line stepper in an open frame exposure array, which incrementally increased exposure energy 20 m J/cm² with a starting exposure energy of 300 mJ/cm². The wafer was then developed with two 60 second puddles with a 0.262N aqueous solution of tetra-methyl ammonium hydroxide, resulting in a array of exposed boxes that were either clear of or containing residue. These boxes were visually inspected for what was exposure energy at which residue were completely cleared from the exposed area. The formulation cleared boxes at a dose of 384 mJ/cm². The unexposed film thickness decreased 6.87 microns to 7.29 microns (48.51% Film thickness loss).

COMPARATIVE EXAMPLE 8

Lithographic Evaluation of a Photosensitive Composition Based on PAC (XIV)

The photosensitive composition obtained in Comparative Example 6 was spin coated on a silicon wafer and then baked on a hotplate for 4 minutes at 120° C., resulting in a film thickness of 14.19 μm. The film was then exposed utilizing an i-line stepper in an open frame exposure array, which incrementally increased exposure energy 20 m J/cm² with a starting exposure energy of 350 mJ/cm². The wafer was then developed with two 50 second puddles with a 0.262N aqueous solution of tetra-methyl ammonium hydroxide, resulting in a array of exposed boxes that were either clear of or containing residue. These boxes were visually inspected for what was exposure energy at which residue were completely cleared from the exposed area. The formulation cleared boxes at a dose of 534 mJ/cm². The unexposed film thickness decreased 5.90 microns to 8.29 microns (41.58% Film thickness loss).

COMPARATIVE EXAMPLE 9

Lithographic Evaluation of a Photosensitive Composition Based on PAC (XIV)

The photosensitive composition obtained in Comparative Example 6 was spin coated on a silicon wafer and then baked on a hotplate for 4 minutes at 120° C., resulting in a film thickness of 14.11 μm. The film was then exposed utilizing an i-line stepper in an open frame exposure array, which incrementally increased exposure energy 20 m J/cm² with a starting exposure energy of 500 mJ/cm². The wafer was then developed with two 40 second puddles with a 0.262N aqueous solution of tetra-methyl ammonium hydroxide, resulting in a array of exposed boxes that were either clear of or containing residue. These boxes were visually inspected for what was exposure energy at which residue were completely cleared from the exposed area. The formulation cleared boxes at a dose of 684 mJ/cm². The unexposed film thickness decreased 4.80 microns to 9.30 microns (34.04% Film thickness loss).

The results of Examples 15-18 are compared with Comparative Examples 6-9 and this shows that although the amount of DNQ is lower in the mixed ester, surprisingly, the performance of the two photosensitive compositions are similar. Lower DNQ amounts decrease the cost of manufacture.

In addition, the present invention includes electronic parts obtained by using the invention composition. The application of the said polybenzoxazole films in semiconductor industry include, but are not limited to, stress relieve coatings for packaged semiconductors, alpha particle barrier films, interlevel dielectrics, insulating films and patterned engineering plastic layers. The examples of articles of commerce made using the disclosed formulation and method include, but not limited to memory devices, such as DRAMs, logic devices, such as microprocessors or microcontrollers, plating stencils, etc.

While the invention has been described herein with reference to the specific embodiments thereof, it will be appreciated that changes, modification and variations can be made without departing from the spirit and scope of the inventive concept disclosed herein. Accordingly, it is intended to embrace all such changes, modification and variations that fall with the spirit and scope of the appended claims.

We claim:
1. A positive photosensitive resin composition comprising:
(a) one or more polybenzoxazole precursor polymers having any of the structures (IV);

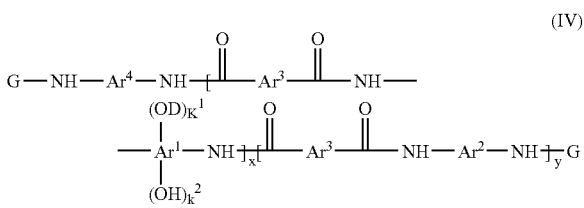

and optionally containing one or more polybenzoxazole precursor polymers of the structure II

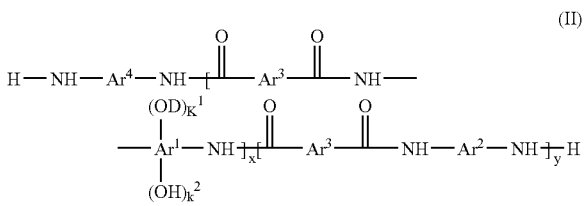

wherein $Ar^1$ is selected from the group consisting of a tetravalent aromatic group, a tetravalent heterocyclic group, and mixtures thereof; $Ar^2$ is selected from the group consisting of a divalent aromatic, a divalent heterocyclic, a divalent alicyclic, and a divalent aliphatic group that may contain silicon; $Ar^3$ is selected from the group consisting of a divalent aromatic group, a divalent aliphatic group, a divalent heterocyclic group, and mixtures thereof; $Ar^4$ is selected from the group consisting of $Ar^1(OD)_k^1(OH)_k^2$ and $Ar^2$, x is from about 10 to about 1000; y is from 0 to about 900; D is selected from the group consisting of one of the following moieties:

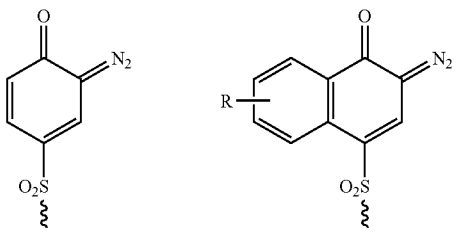

-continued

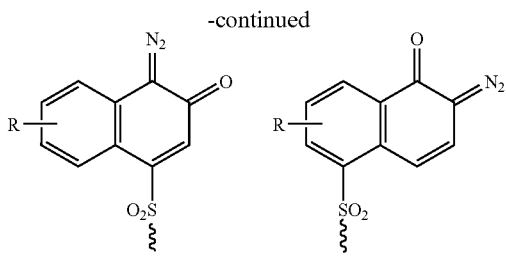

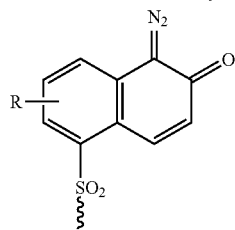

wherein R is selected from the group consisting of H, halogen, $C_1$-$C_4$ alkyl group, $C_1$-$C_4$ alkoxy group, cyclopentyl and cyclohexyl; $k^1$ can be any positive value of up to about 0.5, $k^2$ can be any value from about 1.5 to about 2 with the proviso that $(k^1+k^2)=2$, G monovalent organic group having a group selected from the group consisting of carbonyl, carbonyloxy and sulfonyl group, (b) a diazonaphthoquinone photoactive compound which is the condensation product of a compound containing from 2 to about 9 aromatic hydroxyl groups with a 5-naphthoquinone diazide sulfonyl compound and a 4-naphthoquinone diazide sulfonyl compound, and (c) at least one solvent.

2. A positive photosensitive resin composition according to claim 1, wherein $Ar^1$ is a moiety selected from the group consisting of

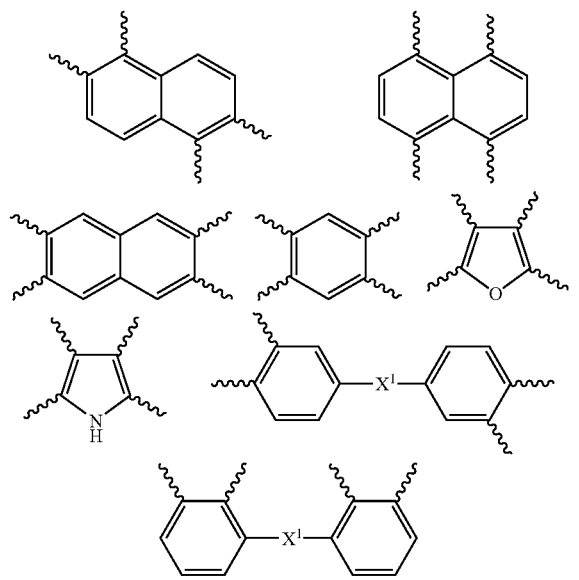

wherein $X^1$ is selected from the group consisting of —O—, —S—, —C(CF$_3$)$_2$—, —CH$_2$—, —SO$_2$—, —NHCO— and —SiR$^9$$_2$— and each $R^9$ is independently selected from the group consisting of a $C_1$-$C_7$ linear or branched alkyl and a $C_5$-$C_8$ cyclooalkyl group.

3. A positive photosensitive resin composition according to claim 1, wherein $Ar^1$ is a moiety derived from a reactant selected from the group consisting of 2,2-bis(3-amino-4-hydroxyphenyl)-hexafluoropropane, 3,3'-dihydroxy-4,4'-diaminodiphenylether, 3,3'-dihydroxybenzidine, 4,6-diaminoresorcinol, and 2,2-bis(3-amino4-hydroxyphenyl)propane and mixtures thereof.

4. A positive photosensitive resin composition according to claim 1, wherein $Ar^2$ is a moiety selected from the group consisting of

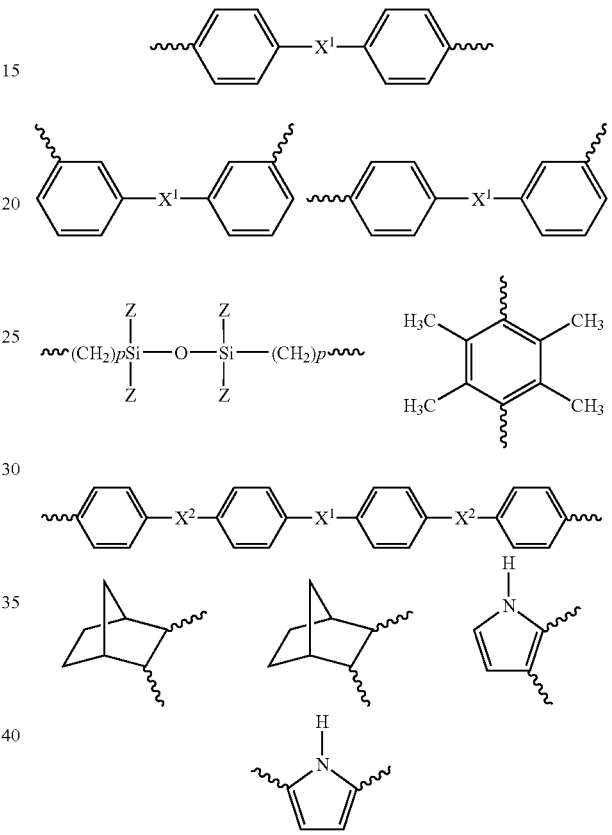

wherein $X^1$ is selected from the group consisting of —O—, —S—, —C(CF$_3$)$_2$—, —CH$_2$—, —SO$_2$—, —NHCO— and —SiR$^9$$_2$— and each $R^9$ is independently selected from the group consisting of a $C_1$-$C_7$ linear or branched alkyl and a $C_5$-$C_8$ cycloalkyl group, $X^2$ is seleceted from the group consisting of —O—, —S—, —C(CF$_3$)$_2$—, —C(CH$_3$)$_2$—, —CH$_2$—, —SO$_2$—and—NHCO—, Z is selected from the group consisting of H and $C_1$-$C_8$ linear, branched or cyclic alkyl and p is an integer from 1 to 6

5. A positive photosensitive resin composition according to claim 1, wherein $Ar^2$ is a moiety derived from a reactant selected from the group consisting of 5(6)-diamino-1-(4-aminophenyl)-1,3,3-trimethylindane (DAPI), m-phenylenediamine, p-phenylenediamine, 2,2'-bis(trifluoromethyl)-4,4'-diamino-1,1'-biphenyl, 3,4'-diaminodiphenyl ether, 3,3'-diaminodiphenyl ether, 2,4-tolylenediamine, 3,3'-diaminodiphenyl sulfone, 3,4'-diaminodiphenyl sulfone, 4,4'-diaminodiphenyl sulfone, 3,3'-diaminodiphenylmethane, 3,4'-diaminodiphenylmethane, 4,4'diaminodiphenyl ketone, 3,3'-diaminodiphenyl ketone, 3,4'-diaminodiphenyl ketone, 1,3-bis (4-aminophenoxy) benzene, 1,3-bis(3-amino-phenoxy) benzene, 1,4-bis (γ-aminopropyl) tetramethyldisiloxane, 2,3,5,6-tetramethyl-p-phenylenediamine, m-xylylenediamine, p-xylylenediamine, methylenediamine, tetramethylenediamine, pentamethylenediamine, hexamethylenediamine, 2,5-dimethylhexamethylenediamine, 3-methoxyhexamethylenediamine, heptamethylenediamine, 2,5-dimethylheptamethylenediamine, 3-methylheptamethylenediamine, 4,4-dimethylheptamethylenediamine, octamethylenediamine, nonamethylenediamine, 2,5-dimethylnonamethylenediamine, decamethylenediamine, ethylenediamine, propylenediamine, 2,2-dimethylpropylenediamine, 1,10-diamino-1,10-dimethyldecane, 2,11-diaminidodecane, 1,12-diaminooctadecane, 2,17-diaminoeicosane, 3,3'-dimethyl-4,4'-diaminodiphenylmethane, bis(4-aminocyclohexyl) methane, 3,3'-diaminodiphenylethane, 4,4'-diaminodiphenylethane, 4,4'-diaminodiphenyl sulfide, 2,6-diaminopyridine, 2,5-diaminopyridine, 2,6-diamino-4-trifluoromethylpyridine, 2,5-diamino-1,3,4,-oxadiazole, 1,4-diaminocyclohexane, 4,4'-methylenedianiline, 4,4'-methylene-bis(o-choloroaniline), 4,4'-methylene-bis(3-methylaniline), 4,4'-methylene-bis(2-ethylaniline), 4,4'-methylene-bis(2-methoxyaniline), 4,4'-oxy-dianiline, 4,4'-oxy-bis-(2-methoxyaniline), 4,4'-oxy-bis-(2-chloroaniline), 4,4'-thio-dianiline, 4,4'-thio-bis-(2-methylaniline), 4,4'-thio-bis-(2-methyoxyaniline), and 4,4'-thio-bis-(2-chloroaniline).

6. A positive photosensitive resin composition according to claim 1, wherein $Ar^3$ is a moiety selected from the group consisting of wherein $X^2$ is selected from the group consisting of —O—, —S—, C(CH$_3$)$_2$—, —C(CF$_3$)$_2$—, —CH$_2$—, —SO$_2$—, and —NHCO—.

7. A positive photosensitive resin composition according to claim 1, wherein $Ar^3$ is a moiety derived from a reactant selected from the group consisting of 4,4'-diphenyletherdicarboxylic acid, terephthalic acid, isophthalic acid, isophthaloyl dichloride, phthaloyl dichloride, terephthaloyl dichloride, 4,4'-diphenyletherdicarboxylic acid dichloride, dimethylisophthalate, dimethylphthalate, dimethylterphthalate, diethylisophthalate, diethylphthalate, diethylterphthalate and mixtures thereof.

8. A positive photosensitive resin composition according to claim 1, wherein G is selected from the group consisting of moieties of the following structures;

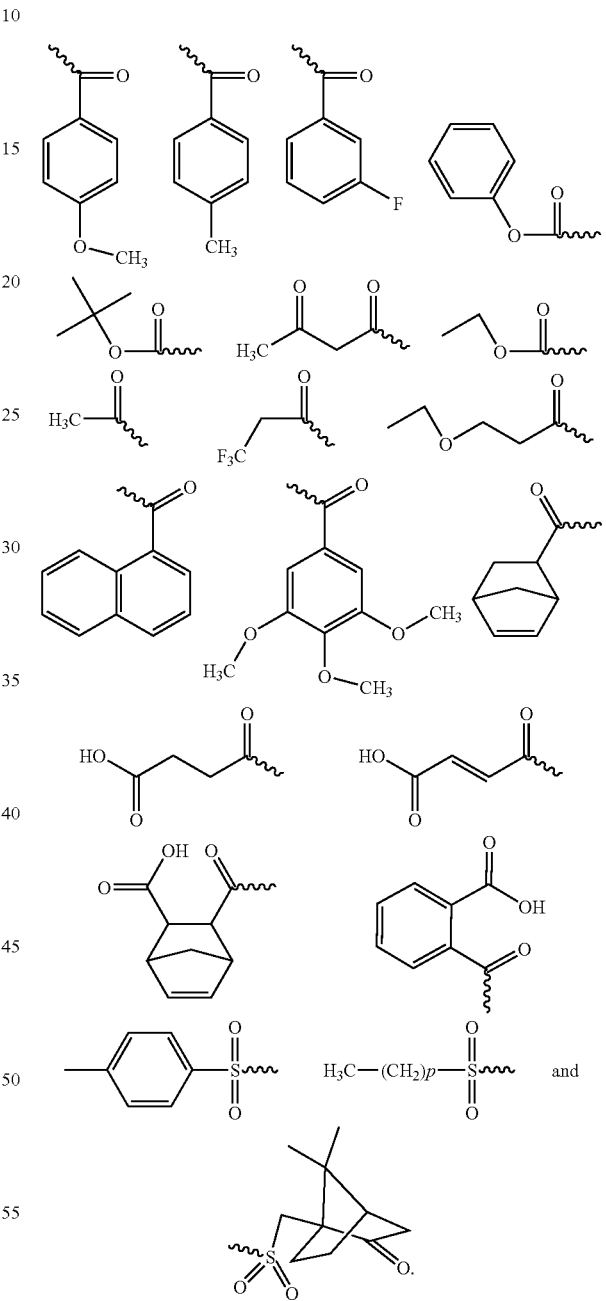

9. A positive photosensitive resin composition according to claim 1, wherein x is from about 10 to about 100 and y is from about 0 to 100.

10. A positive photosensitive resin composition according to claim 1, wherein the diazoquinone photoactive compound (b) is selected from the group consisting of compounds of the formula:

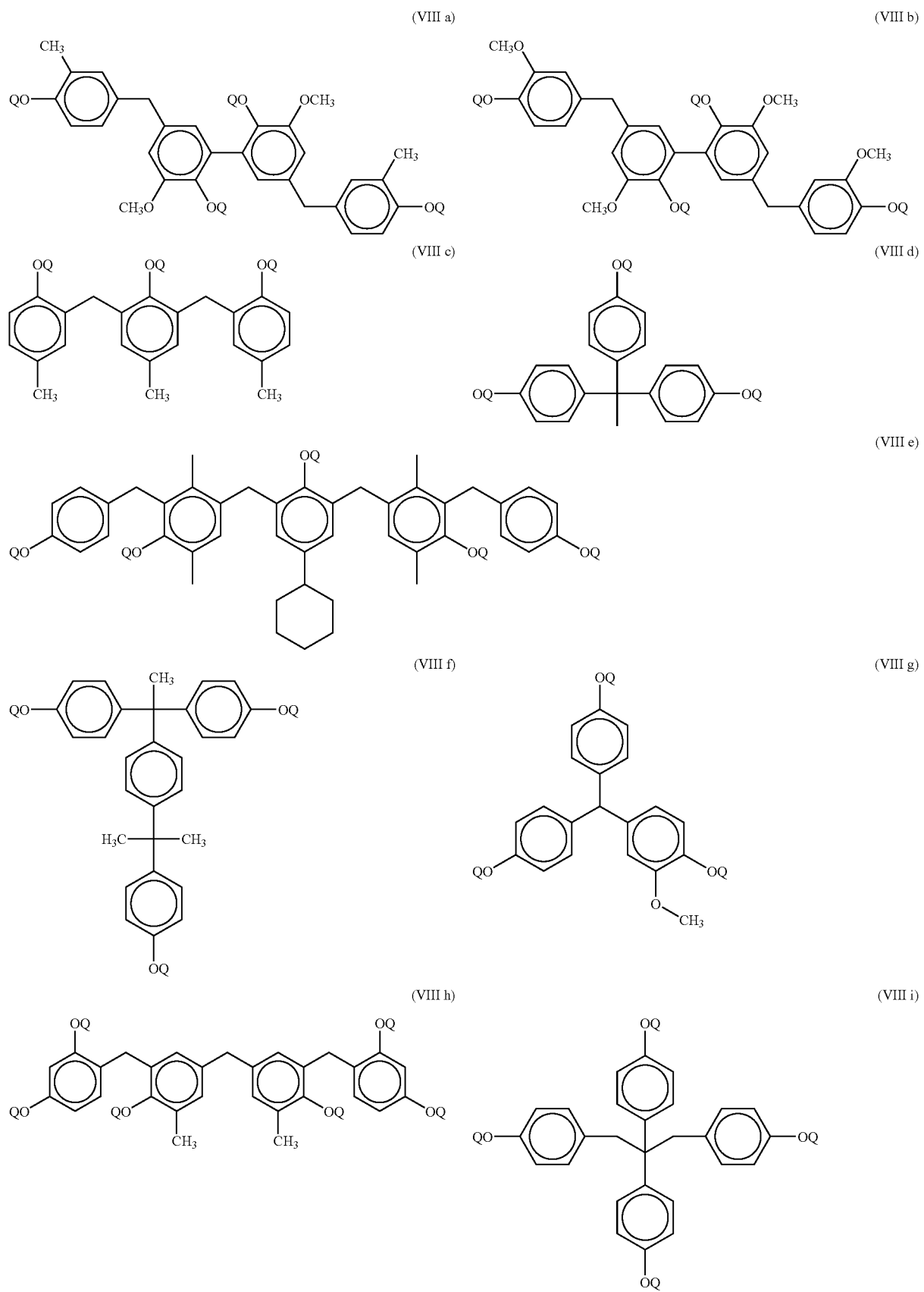

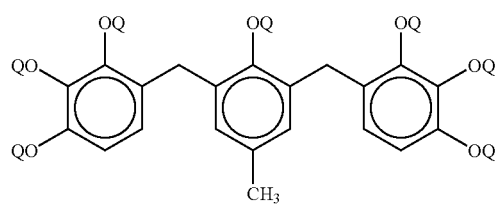
(VIII j)
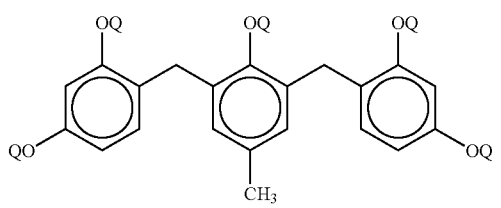
(VIII k)
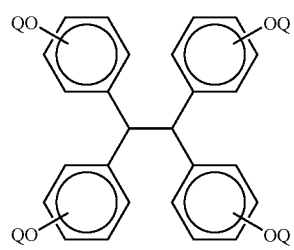
(VIII l)
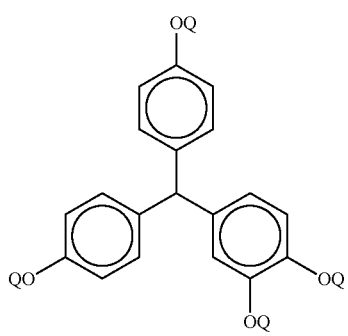
(VIII m)
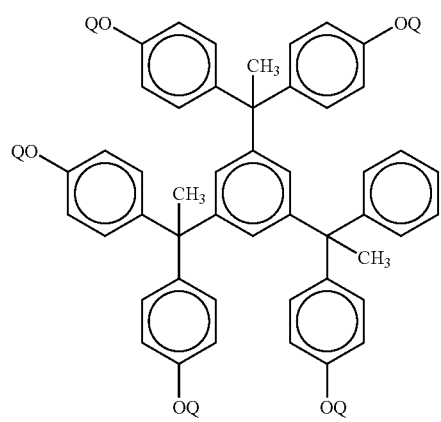
(VIII n)
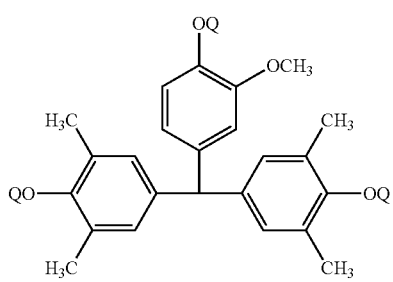
(VIII o)
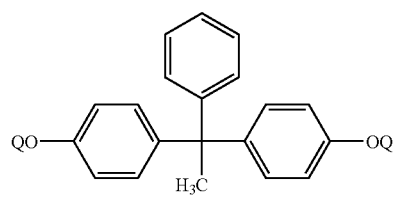
(VIII p)
wherein at least one Q is the moiety (IX) and another Q is the moiety (X) with any remainder being H and wherein moieties (IX) and (X) are
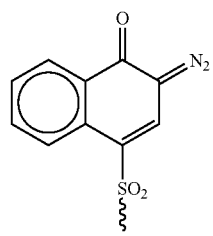
(IX)
-continued
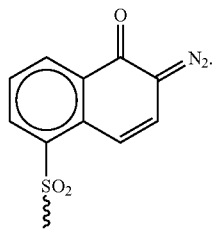
(X)

11. A positive photosensitive resin composition according to claim 10, wherein the ratio of (IX) to (X) is from about 20/80 to 80/20 and Q=H is from about 2% to about 34%.

12. A positive photosensitive resin composition according to claim 1 additionally comprising an adhesion promoter.

13. A positive photosensitive resin composition according to claim 12 wherein the adhesion promoter is one of the formula of Structure (XI)

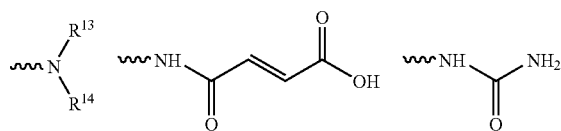
(XI)

wherein each $R^{10}$ is independently selected from the group consisting of a $C_1$-$C_4$ alkyl group and a $C_5$-$C_7$ cycloalkyl $R^{11}$ is independently selected from the group consisting of a $C_1$-$C_4$ alkyl group, a $C_1$-$C_4$ alkoxy group, a $C_5$-$C_7$ cycloalkyl group and a $C_5$-$C_7$ cycloalkoxy group; d is an integer from 0 to 3 and n is an integer from 1 to about 6, and $R^{12}$ is a moiety selected from the group consisting of the following moieties:

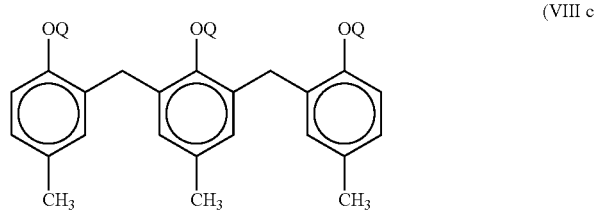

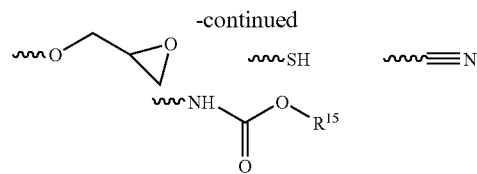

wherein each $R^{13}$ and $R^{14}$ are independently selected from the group consisting of a $C_1$-$C_4$ alkyl group and a $C_5$-$C_7$ cycloalkyl group, and $R^{15}$ is selected from the group consisting of a $C_1$-$C_4$ alkyl group and a $C_5$-$C_7$ cycloalkyl group.

14. A positive photosensitive resin composition according to claim 1, wherein $Ar^1$ is a moiety derived from a reactant selected from the group consisting of 2,2-bis(3-amino4-hydroxyphenyl)-hexafluoropropane, 3,3'-dihydroxy-4,4'-diaminodiphenylether, 3,3'-dihydroxybenzidine, 4,6-diaminoresorcinol, and 2,2-bis(3-amino4-hydroxyphenyl)propane and mixtures thereof, $ar^3$ is a moiety derived from a reactant selected from the group consisting of 4,4'-diphenyletherdicarboxylic acid, terephthalic acid, isophthalic acid, isophthaloyl dichloride, phthaloyl dichloride, terephthaloyl dichloride, 4,4'-diphenyletherdicaroxylicboxlic acid dichloride, dimethylisophthalate, dimethylphthalate, dimethylterphthalate, diethylisophthalate, diethylphthalate, diethylterphthalate and mixtures thereof, the diazoquinone photoactive compound (b) is selected from the group consisting of compounds of the formula:

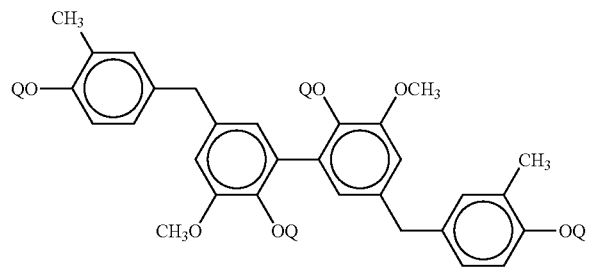
(VIII a)

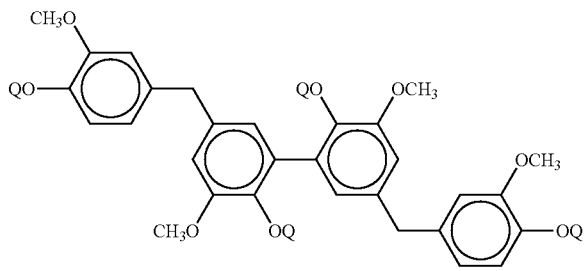
(VIII b)

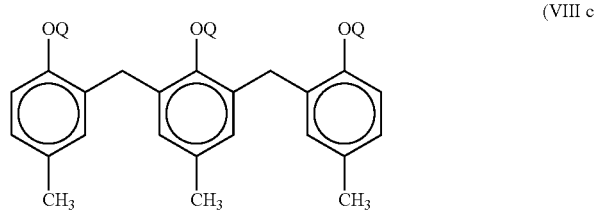
(VIII c)

(VIII d)

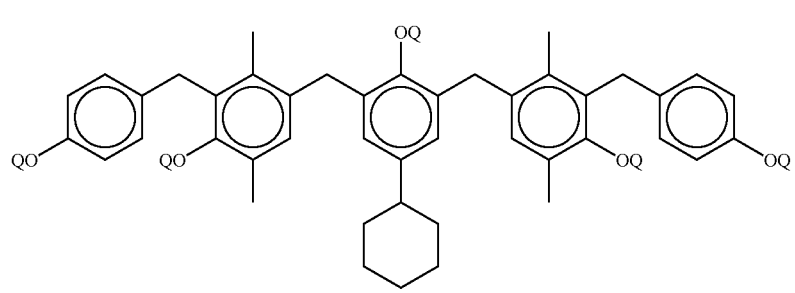
(VIII e)

-continued
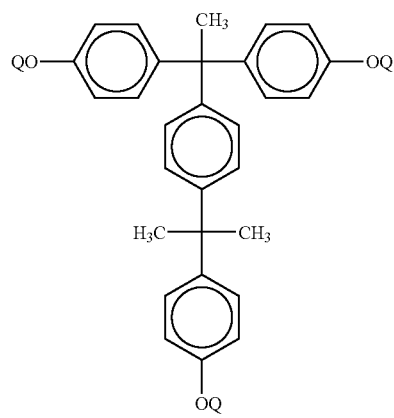
(VIII f)
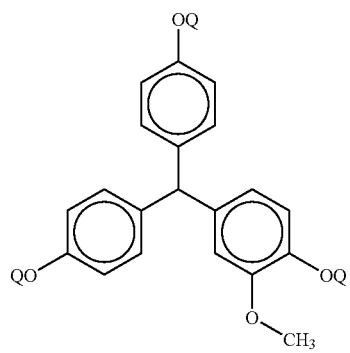
(VIII g)
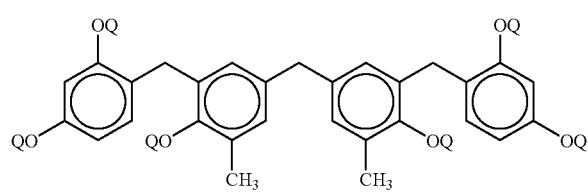
(VIII h)
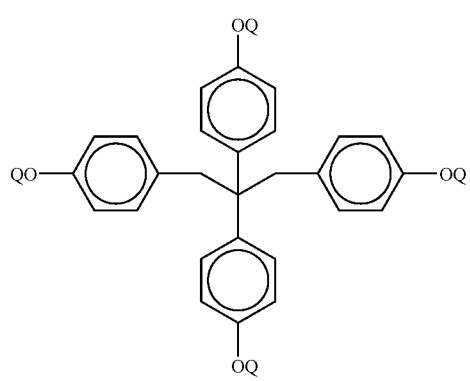
(VIII i)
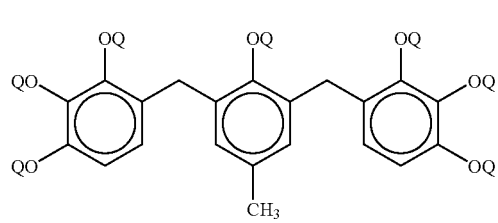
(VIII j)
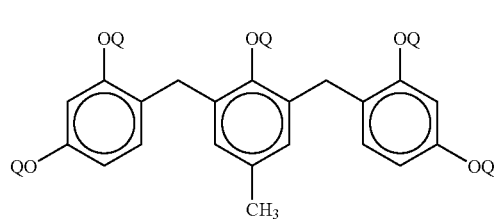
(VIII k)
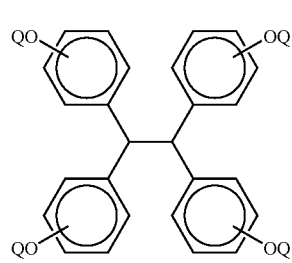
(VIII l)
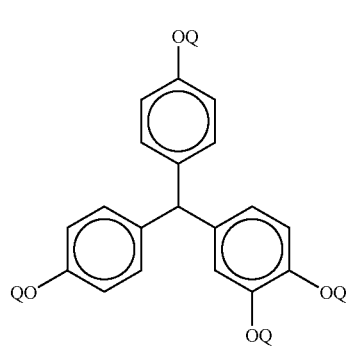
(VIII m)

-continued

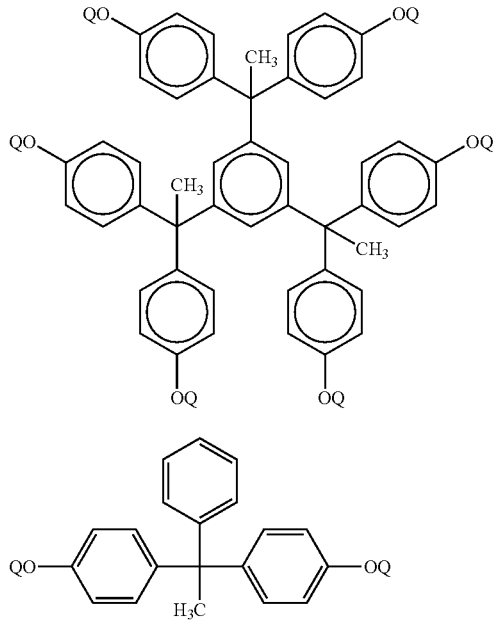
(VIII n)

(VIII o)

(VIII p)

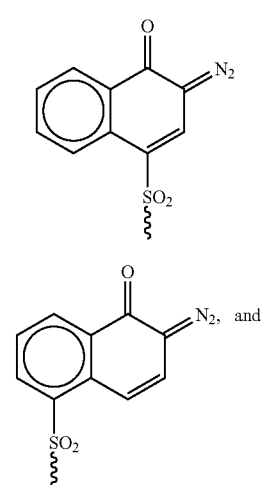

wherein at least one Q is the moiety (IX) and another Q is the moiety (X) with any and wherein moieties (IX) and (X) are.

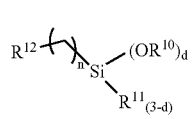
(IX)

(X)

the composition additionally comprises and adhesion promoter wherein the adhesion promoter is one of the formula of Structure (XI)

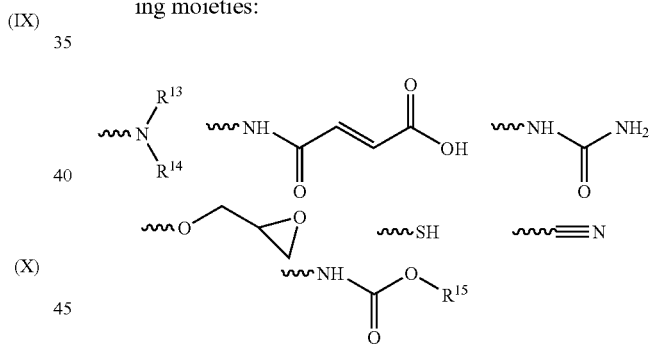
(XI)

wherein each $R^{10}$ is independently selected from the group consisting of a $C_1$-$C_4$ alkyl group and a $C_5$-$C_7$ cycloalkyl group and $R^{15}$ independently selected from the group consisting of a $C_1$-$C_4$ alkoxy group, a $C_5$-$C_7$ cycloalkoxy group and a $C_5$-$C_7$ cycloalkoxy group; d is an integer from 0 to 3 and n is an integer from 1 to about 6, and $R^{12}$ is a moiety selected from group consisting of the following moieties:

wherein each $R^{13}$ and $R^{14}$ are independently selected from the group consisting of a $C_1$-$C_4$ alkyl group and a $C_5$-$C_7$ cycloalkyl group, and $R^{15}$ is selected from the group consisting of a $C_1$-$C_4$ alkyl group and a $C_5$-$C_7$ cycloalky 15. A process for forming a relief pattern on a substrate, the process comprises the steps of:
 (a) coating on a suitable substrate, a positive-working photosensitive composition of claim 1, thereby forming a coated substrate;
 (b) prebaking the coated substrate;
 (c) exposing the prebaked coated substrate to actinic radiation;
 (d) developing the exposed coated substrate with an aqueous developer, thereby forming an uncured relief image on the coated substrate; and
 (e) baking the developed coated substrate at an elevated temperature, thereby curing the relief image.

16. A process for forming a relief pattern on a substrate, the process comprises the steps of:
  (a). coating on a suitable substrate, a positive-working photosensitive composition of claim 2 thereby forming a coated substrate;
  (b) prebaking the coated substrate;
  (c) exposing the prebaked coated substrate to actinic radiation;
  (d) developing the exposed coated substrate with an aqueous developer, thereby forming an uncured relief image on the coated substrate; and
  (e) baking the developed coated substrate at an elevated temperature, thereby curing the relief image.

17. A process for forming a relief pattern on a substrate, the process comprises the steps of:
  (a). coating on a suitable substrate, a positive-working photosensitive composition of claim 3 thereby forming a coated substrate;
  (b) prebaking the coated substrate;
  (c) exposing the prebaked coated substrate to actinic radiation;
  (d) developing the exposed coated substrate with an aqueous developer, thereby forming an uncured relief image on the coated substrate; and
  (e) baking the developed coated substrate at an elevated temperature, thereby curing the relief image.

18. A process for forming a relief pattern on a substrate, the process comprises the steps of:
  (a). coating on a suitable substrate, a positive-working photosensitive composition of claim 4 thereby forming a coated substrate;
  (b) prebaking the coated substrate;
  (c) exposing the prebaked coated substrate to actinic radiation;
  (d) developing the exposed coated substrate with an aqueous developer, thereby forming an uncured relief image on the coated substrate; and
  (e) baking the developed coated substrate at an elevated temperature, thereby curing the relief image.

19. A process for forming a relief pattern on a substrate, the process comprises the steps of:
  (a). coating on a suitable substrate, a positive-working photosensitive composition of claim 5 thereby forming a coated substrate;
  (b) prebaking the coated substrate;
  (c) exposing the prebaked coated substrate to actinic radiation;
  (d) developing the exposed coated substrate with an aqueous developer, thereby forming an uncured relief image on the coated substrate; and
  (e) baking the developed coated substrate at an elevated temperature, thereby curing the relief image.

20. A process for forming a relief pattern on a substrate, the process comprises the steps of:
  (a). coating on a suitable substrate, a positive-working photosensitive composition of claim 6 thereby forming a coated substrate;
  (b) prebaking the coated substrate;
  (c) exposing the prebaked coated substrate to actinic radiation;
  (d) developing the exposed coated substrate with an aqueous developer, thereby forming an uncured relief image on the coated substrate; and
  (e) baking the developed coated substrate at an elevated temperature, thereby curing the relief image.

21. A process for forming a relief pattern on a substrate, the process comprises the steps of:
  (a). coating on a suitable substrate, a positive-working photosensitive composition of claim 7 thereby forming a coated substrate;
  (b) prebaking the coated substrate;
  (c) exposing the prebaked coated substrate to actinic radiation;
  (d) developing the exposed coated substrate with an aqueous developer, thereby forming an uncured relief image on the coated substrate; and
  (e) baking the developed coated substrate at an elevated temperature, thereby curing the relief image.

22. A process for forming a relief pattern on a substrate, the process comprises the steps of:
  (a). coating on a suitable substrate, a positive-working photosensitive composition of claim 8 thereby forming a coated substrate;
  (b) prebaking the coated substrate;
  (c) exposing the prebaked coated substrate to actinic radiation;
  (d) developing the exposed coated substrate with an aqueous developer, thereby forming an uncured relief image on the coated substrate; and
  (e) baking the developed coated substrate at an elevated temperature, thereby curing the relief image.

23. A process for forming a relief pattern on a substrate, the process comprises the steps of:
  (a). coating on a suitable substrate, a positive-working photosensitive composition of claim 9 thereby forming a coated substrate;
  (b) prebaking the coated substrate;
  (c) exposing the prebaked coated substrate to actinic radiation;
  (d) developing the exposed coated substrate with an aqueous developer, thereby forming an uncured relief image on the coated substrate; and
  (e) baking the developed coated substrate at an elevated temperature, thereby curing the relief image.

24. A process for forming a relief pattern on a substrate, the process comprises the steps of:
  (a). coating on a suitable substrate, a positive-working photosensitive composition of claim 10 thereby forming a coated substrate;
  (b) prebaking the coated substrate;
  (c) exposing the prebaked coated substrate to actinic radiation;
  (d) developing the exposed coated substrate with an aqueous developer, thereby forming an uncured relief image on the coated substrate; and
  (e) baking the developed coated substrate at an elevated temperature, thereby curing the relief image.

25. A process for forming a relief pattern on a substrate, the process comprises the steps of:
  (a). coating on a suitable substrate, a positive-working photosensitive composition of claim 11 thereby forming a coated substrate;
  (b) prebaking the coated substrate;
  (c) exposing the prebaked coated substrate to actinic radiation;
  (d) developing the exposed coated substrate with an aqueous developer, thereby forming an uncured relief image on the coated substrate; and
  (e) baking the developed coated substrate at an elevated temperature, thereby curing the relief image.

26. A process for forming a relief pattern on a substrate, the process comprises the steps of:
(a). coating on a suitable substrate, a positive-working photosensitive composition of claim 12 thereby forming a coated substrate;
(b) prebaking the coated substrate;
(c) exposing the prebaked coated substrate to actinic radiation;
(d) developing the exposed coated substrate with an aqueous developer, thereby forming an uncured relief image on the coated substrate; and
(e) baking the developed coated substrate at an elevated temperature, thereby curing the relief image.

27. A process for forming a relief pattern on a substrate, the process comprises the steps of:
(a). coating on a suitable substrate, a positive-working photosensitive composition of claim 13 thereby forming a coated substrate;
(b) prebaking the coated substrate;
(c) exposing the prebaked coated substrate to actinic radiation;
(d) developing the exposed coated substrate with an aqueous developer, thereby forming an uncured relief image on the coated substrate; and
(e) baking the developed coated substrate at an elevated temperature, thereby curing the relief image.

28. A process for forming a relief pattern on a substrate, the process comprises the steps of:
(a) coating on a suitable substrate, a positive-working photosensitive composition of claim 14 thereby forming a coated substrate;
(b) prebaking the coated substrate;
(c) exposing the prebaked coated substrate to actinic radiation;
(d) developing the exposed coated substrate with an aqueous developer, thereby forming an uncured relief image on the coated substrate; and
(e) baking the developed coated substrate at an elevated temperature, thereby curing the relief image.

29. A substrate with a relief pattern formed by the process of claim 15.

30. A substrate with a relief pattern formed by the process of claim 16.

31. A substrate with a relief pattern formed by the process of claim 17.

32. A substrate with a relief pattern formed by the process of claim 18.

33. A substrate with a relief pattern formed by the process of claim 19.

34. A substrate with a relief pattern formed by the process of claim 20.

35. A substrate with a relief pattern formed by the process of claim 21.

36. A substrate with a relief pattern formed by the process of claim 22.

37. A substrate with a relief pattern formed by the process of claim 23.

38. A substrate with a relief pattern formed by the process of claim 24.

39. A substrate with a relief pattern formed by the process of claim 25.

40. A substrate with a relief pattern formed by the process of claim 26.

41. A substrate with a relief pattern formed by the process of claim 27.

42. A substrate with a relief pattern formed by the process of claim 28.

43. An article of commerce having incorporated therein a patterned image of claim 29.

44. An article of commerce having incorporated therein a patterned image of claim 41.

45. An article of commerce of claim 43 wherein the item of commerce is selected from the group consisting of memory devices, logic devices and plating stencils.

46. An article of commerce of claim 44 wherein the item of commerce is selected from the group consisting of memory devices, logic devices and plating stencils.

* * * * *

UNITED STATES PATENT AND TRADEMARK OFFICE
CERTIFICATE OF CORRECTION

PATENT NO. : 7,416,830 B2
APPLICATION NO. : 10/966349
DATED : August 26, 2008
INVENTOR(S) : Ahmad A. Naiini It is certified that error appears in the above-identified patent and that said Letters Patent is hereby corrected as shown below:

Column 60
Line 18, delete "any of the structures" insert -- the structure --.

Line 31, delete "II" insert -- (II) --.

Column 61
Line 26, after "G" insert -- is a --.

Line 67, delete "cyclooalkyl" insert -- cycloalkyl --.

Column 62
Line 6, delete "amino4" insert -- amino-4 --.

Line 50, delete "seleceted" insert -- selected --.

Line 52, delete "–and" insert -- –, and --.

Line 55, after "6" insert -- . --.

Line 66, delete "4,4'diaminodiphe-" insert -- 4,4'-diaminodiphe- --.

Column 63
Line 24, delete "choloroaniline" insert -- chloroaniline --.

Line 61, delete "C(CH$_3$)$_2$–" insert -- –C(CH$_3$)$_2$– --.

Column 64
Lines 3-4, delete "dimethylterphthalate" insert -- dimethylterephthalate --.

Lines 4-5, delete "diethylterphthalate" insert -- diethylterephthalate --.

UNITED STATES PATENT AND TRADEMARK OFFICE
CERTIFICATE OF CORRECTION

PATENT NO. : 7,416,830 B2  
APPLICATION NO. : 10/966349  
DATED : August 26, 2008  
INVENTOR(S) : Ahmad A. Naiini It is certified that error appears in the above-identified patent and that said Letters Patent is hereby corrected as shown below:

Column 66

Line 2 (approx.), delete " 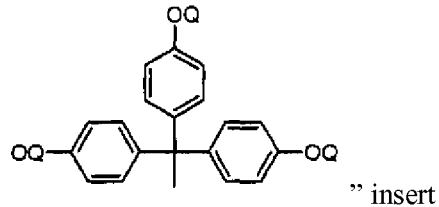 " insert

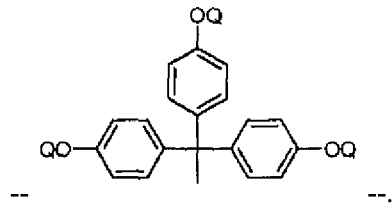

-- --.

Column 67

Line 3, delete " 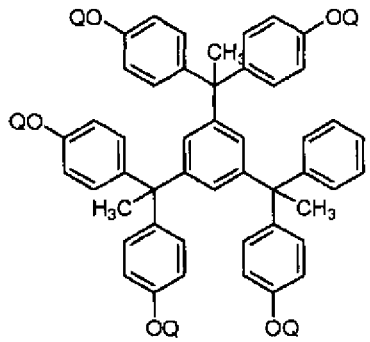 " insert

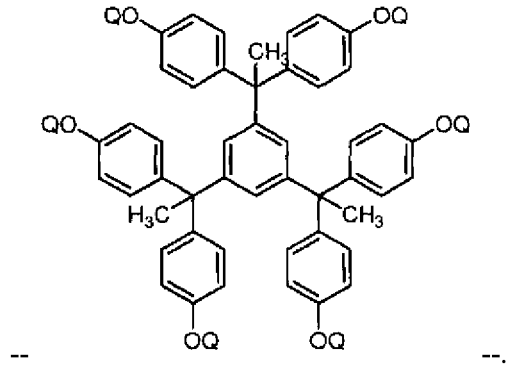

-- --.

UNITED STATES PATENT AND TRADEMARK OFFICE
CERTIFICATE OF CORRECTION

PATENT NO. : 7,416,830 B2
APPLICATION NO. : 10/966349
DATED : August 26, 2008
INVENTOR(S) : Ahmad A. Naiini It is certified that error appears in the above-identified patent and that said Letters Patent is hereby corrected as shown below:

Column 69
Line 18, after "cycloalkyl" insert -- group and each --.

Column 70
Line 18, delete "amino4" insert -- amino-4 --.

Line 21, delete "amino4" insert -- amino-4 --.

Line 22, delete "ar$^3$" insert -- Ar$^3$ --.

Line 26, delete "diphenyletherdicaroxylicboxlic" insert -- diphenyletherdicarboxylic --.

Lines 27-28, delete "dimethylterphthalate," insert -- dimethylterephthalate --.

Lines 28-29, delete "diethylterphthalate" insert -- diethylterephthalate --.

Line 32 (approx.), delete " 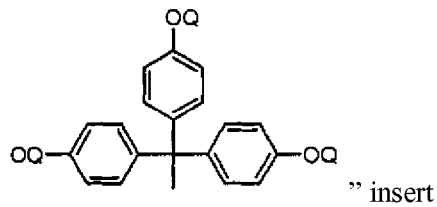 " insert 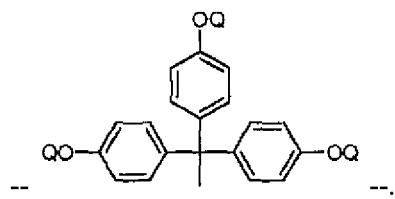 -- --.

Column 73
Line 30, before "and wherein" insert -- remainder being H --.

Line 31, after "are" delete ".".

Line 67, delete "R$^{15}$" insert -- each R$^{11}$ --.

UNITED STATES PATENT AND TRADEMARK OFFICE
CERTIFICATE OF CORRECTION

PATENT NO. : 7,416,830 B2
APPLICATION NO. : 10/966349
DATED : August 26, 2008
INVENTOR(S) : Ahmad A. Naiini It is certified that error appears in the above-identified patent and that said Letters Patent is hereby corrected as shown below:

Column 74
Line 30, after "consisting of a" insert -- $C_1$ –$C_4$ alkyl group, a --.

Line 33, after "from" insert -- the --.

Line 52, delete "cycloalky" insert -- cycloalkyl group. --.

Signed and Sealed this

Seventh Day of April, 2009

JOHN DOLL
*Acting Director of the United States Patent and Trademark Office*

UNITED STATES PATENT AND TRADEMARK OFFICE
CERTIFICATE OF CORRECTION

PATENT NO. : 7,416,830 B2  Page 1 of 1
APPLICATION NO. : 10/966349
DATED : August 26, 2008
INVENTOR(S) : Ahmad A. Naiini et al.

It is certified that error appears in the above-identified patent and that said Letters Patent is hereby corrected as shown below:

Title Page, item 22

Delete "Feb. 18, 2005" and insert -- October 15, 2004 --.

Signed and Sealed this

Eighth Day of December, 2009

David J. Kappos
*Director of the United States Patent and Trademark Office*